US 8,654,056 B2

(12) United States Patent
Otose et al.

(10) Patent No.: US 8,654,056 B2
(45) Date of Patent: Feb. 18, 2014

(54) SEMICONDUCTOR CIRCUIT AND DISPLAY APPARATUS EMPLOYING THE SAME

(75) Inventors: Tomohiko Otose, Kanagawa (JP); Masamichi Shimoda, Kanagawa (JP)

(73) Assignee: NLT Technologies, Ltd., Kanagawa (JP)

( * ) Notice: Subject to any disclaimer, the term of this patent is extended or adjusted under 35 U.S.C. 154(b) by 0 days.

(21) Appl. No.: 13/339,804

(22) Filed: Dec. 29, 2011

(65) Prior Publication Data

US 2012/0112992 A1    May 10, 2012

Related U.S. Application Data

(62) Division of application No. 12/174,808, filed on Jul. 17, 2008, now abandoned.

(30) Foreign Application Priority Data

Jul. 17, 2007 (JP) ................................. 2007-185974

(51) Int. Cl.
*G09G 3/36* (2006.01)
*G06F 3/038* (2013.01)
*G11C 19/00* (2006.01)

(52) U.S. Cl.
USPC ............. 345/100; 345/99; 345/208; 345/213; 377/69; 377/78

(58) Field of Classification Search
USPC ................ 345/87, 92–96, 98–100, 204–206, 345/208–215; 377/64–81
See application file for complete search history.

(56) References Cited

U.S. PATENT DOCUMENTS

| | | | |
|---|---|---|---|
| 6,232,939 B1 * | 5/2001 | Saito et al. ...................... | 345/93 |
| 6,339,631 B1 * | 1/2002 | Yeo et al. ........................ | 377/64 |
| 6,670,944 B1 * | 12/2003 | Ishii ............................... | 345/100 |
| 2003/0002615 A1 * | 1/2003 | Morosawa et al. ............. | 377/64 |
| 2004/0104882 A1 * | 6/2004 | Kitani et al. ................... | 345/100 |
| 2005/0116914 A1 * | 6/2005 | Nagao et al. ................... | 345/92 |
| 2007/0217564 A1 * | 9/2007 | Tobita ............................. | 377/64 |

FOREIGN PATENT DOCUMENTS

| | | |
|---|---|---|
| JP | 2004-134053 | 4/2004 |
| JP | 2004-185684 | 7/2004 |
| JP | 2004-288697 | 10/2004 |

* cited by examiner

*Primary Examiner* — Bipin Shalwala
*Assistant Examiner* — Keith Crawley
(74) *Attorney, Agent, or Firm* — Young & Thompson

(57) ABSTRACT

Disclosed is a display apparatus including two scanning circuits of the same configuration and layout, arranged on either sides of the display part. As long as one of the scanning circuits is in operation, the other scanning circuit is in a state in which no output signal is output.

2 Claims, 35 Drawing Sheets

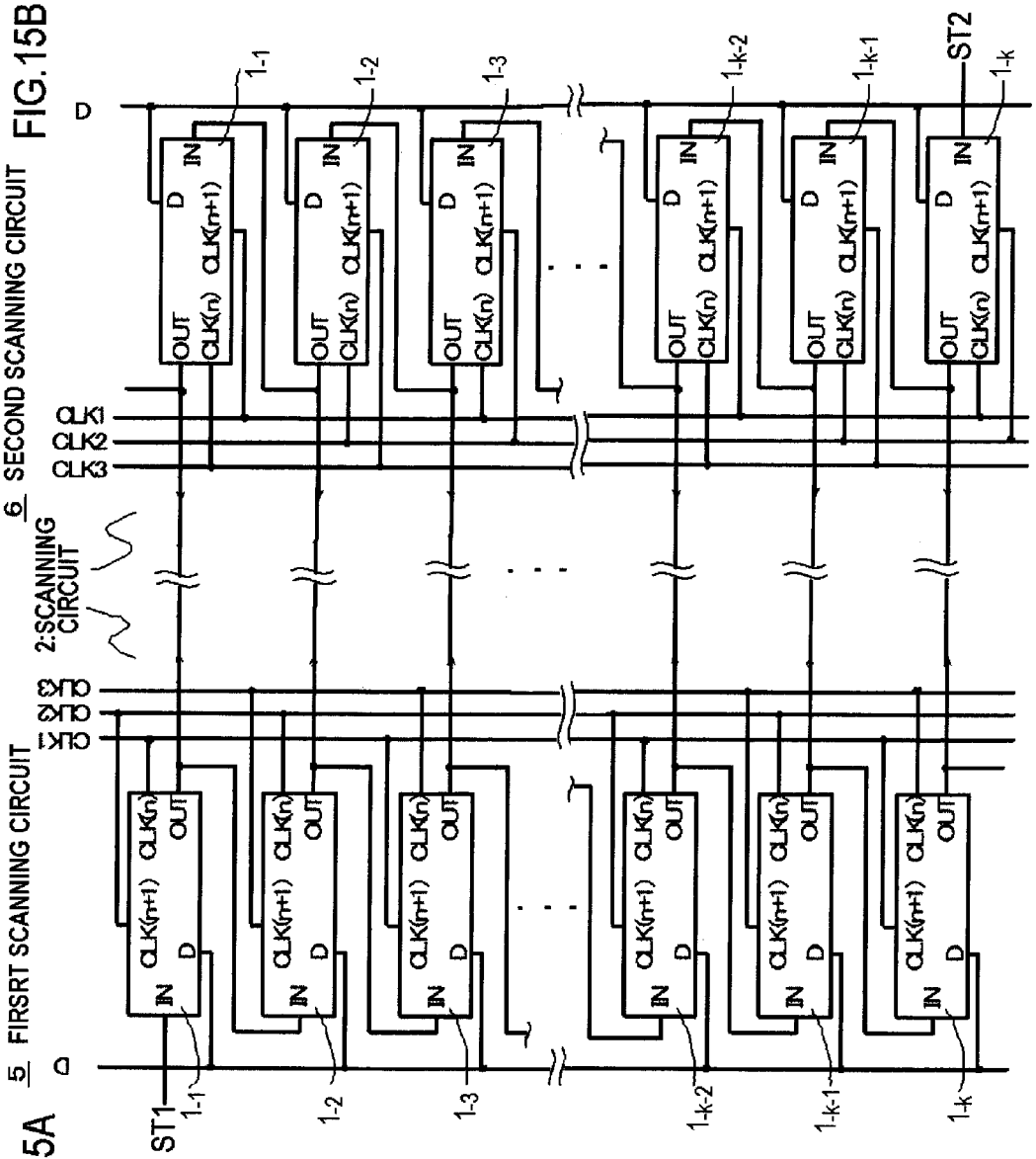

FIG.33A
RELATED ART
1560: MULTI-STAGE SHIFT REGISTER CIRCUIT
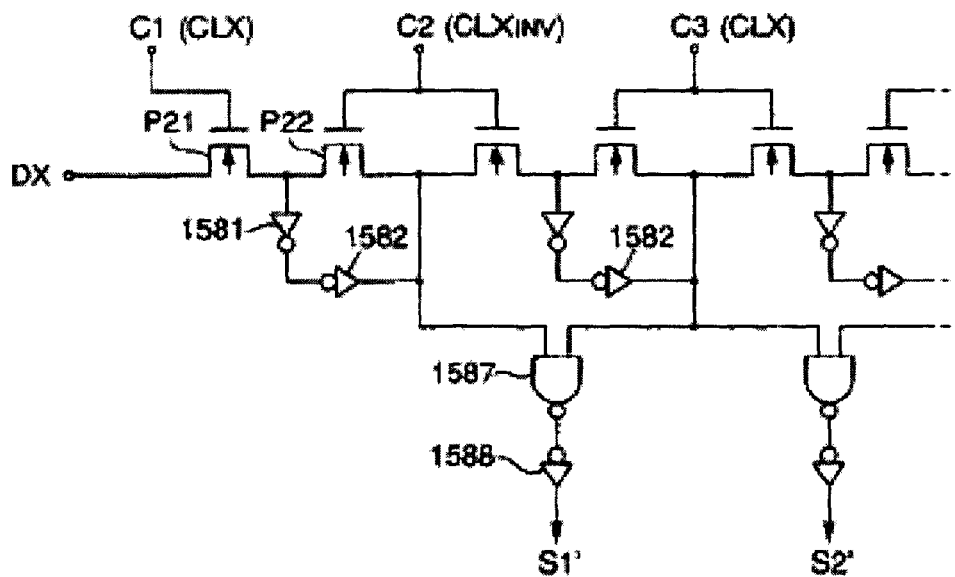
FIG.33B  RELATED ART  1570: MULTI-STAGE SHIFT REGISTER CIRCUIT (BIDIRECTIONAL)
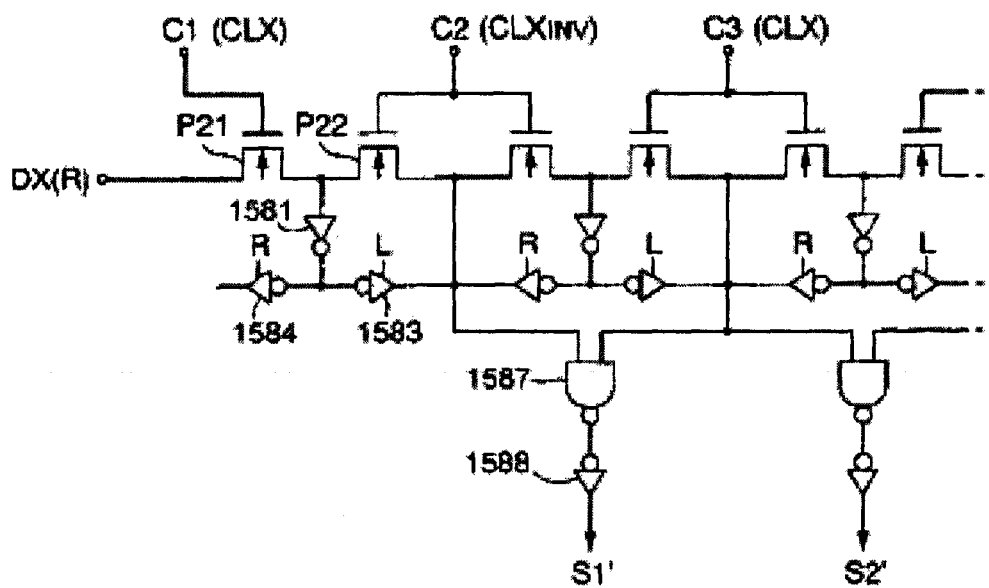

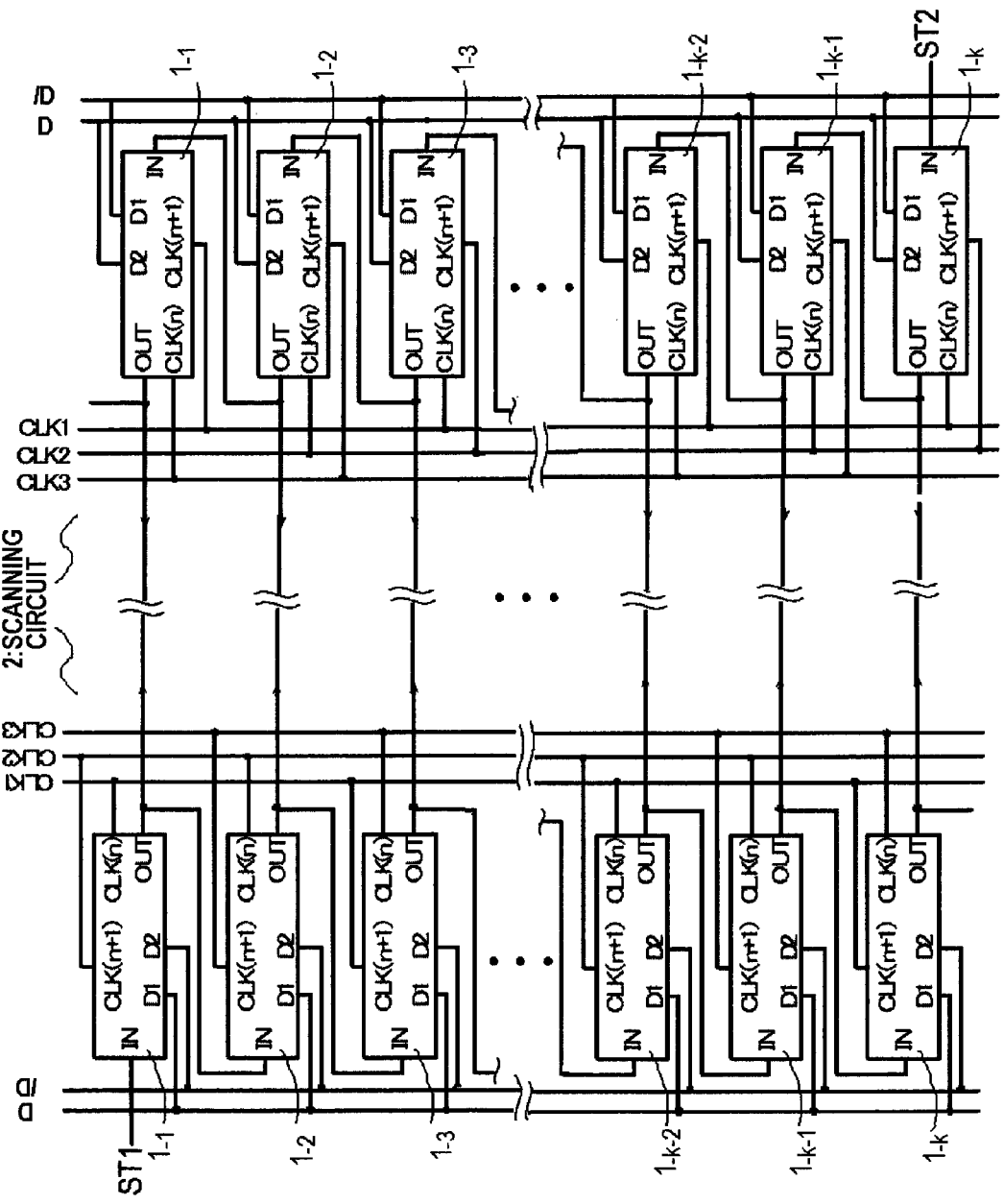

SEMICONDUCTOR CIRCUIT AND DISPLAY APPARATUS EMPLOYING THE SAME

CROSS REFERENCE TO RELATED APPLICATION

This application is a division of co-pending application Ser. No. 12/174,808 filed Jul. 17, 2008, which claims foreign priority to Japanese patent application 2007-185974 filed Jul. 17, 2007. The entire content of each of these applications is hereby expressly incorporated by reference.

FIELD OF THE INVENTION

This invention relates to a semiconductor circuit, and a semiconductor device employing the same. More particularly, it relates to a shift register circuit that may be used to advantage for a scanning circuit, a display apparatus employing the same, and to a method for driving the display apparatus.

DESCRIPTION OF RELATED ART

A planar display apparatus, exemplified by a liquid crystal display apparatus, is used in these days as a display apparatus for a variety of equipment, because the planar display apparatus is thin in thickness, lightweight and low in power consumption. Recently, such a technique has become established in which, to realize a thinner thickness, a lighter weight and a lower cost, a driving circuit is formed using a low temperature polysilicon thin film transistor, having an electron mobility higher than that of a conventional amorphous silicon thin film transistor, and in which the so formed driving circuit is mounted unitarily on a glass substrate.

Recently, an LCD (Liquid Crystal Display) with built-in driving circuits has been developed. With this LCD, with built-in driving circuits, a matrix display section and a peripheral driving circuit unit are formed on one and the same substrate by using polycrystalline silicon as a material for a TFT channel layer.

In general, polycrystalline silicon is higher in mobility than amorphous silicon. Hence, a polycrystalline silicon TFT may be formed to a smaller size, thereby enabling higher definition.

Moreover, since miniaturization may be brought about by a gate self-aligned structure and high operating speed may be accomplished by reduction of parasitic capacitance, the LCD module may be reduced in size by forming CMOS transistors, each of which is made up of an NMOS transistor and a PMOS transistor.

Recently, the demand for a higher definition of a liquid crystal display apparatus is becoming more stringent. The higher the resolution, the greater becomes the amount of information that may be displayed at a time. Hence, the high resolution contributes to an improved added value of the liquid crystal display apparatus. In addition, if the scanning direction of a display apparatus is made bidirectional, it may become possible to flexibly cope with the various orientation of the liquid crystal device.

A high added-value liquid crystal display apparatus, having a high-resolution display area and a bidirectional scanning circuit, has therefore been a desideratum.

In Patent Publication 1, for example, there is disclosed a bidirectional shift register formed by single channel transistors. This bidirectional shift register is now described with reference to FIGS. 27 to 30.

FIG. 27 schematically shows a planar display apparatus disclosed in Patent Publication 1. FIG. 28 schematically shows a configuration of a three-phase bidirectional shift register disclosed in Patent Publication 1. FIG. 29 is a timing chart for illustrating the operation of the three phase bidirectional shift register disclosed in Patent Publication 1 at the time of pulse shifting in the forward direction. FIG. 30 is a timing chart for illustrating the operation of the three phase bidirectional shift register disclosed in Patent Publication 1 at the time of pulse shifting in the reverse direction. The three phase bidirectional shift register is a circuit which is made up of a plural number of shift registers of the same configuration, connected in cascade, and which provides for pulse shifting in both the forward direction and in the reverse direction. With the use of three clock signals, different in phase, a pulse entered to an initial stage unit register, such as FF (flop-flop), is propagated to downstream side unit registers, as the pulse entered to the initial stage shift register is phase-shifted from one shift register to the next.

Referring to FIG. 27, this conventional planar display apparatus includes an array substrate 101, on which there are mounted a scanning line driving circuit 102, a signal line driving circuit 103 and a plural number of, herein (m×n) switching devices 110.

It is noted that scanning lines G1 to Gn are wirings for transferring outputs of the scanning line driving circuit 102 as control signals for the switching devices 110, while signal lines S1 to Sm are wirings for transferring outputs of the signal line driving circuit 103 to sources and drains of the switching devices 110.

Referring to FIG. 28, a three phase bidirectional shift register includes a first clock terminal INP, a reverse-direction pulse input terminal INN, an output terminal OUT, shift direction control signals P and N, and transistors Tr1 to Tr17.

Referring to FIGS. 29 and 30, the bidirectional shift register is able to cope with both the shifting in the forward direction and that in the reverse direction.

The bidirectional shift register, disclosed in Patent Publication 2, is now described. FIG. 31 is a block diagram showing the configuration of a shift register disclosed in Patent Publication 2. Referring to FIG. 31, this shift register includes unit registers Res1, Res2, . . . , transistors Tr4-1, Tr4-2 . . . , transistors Tr5-1, Tr5-2 . . . , and transistors Tr6-1, Tr6-2 . . . .

The transistors Tr4 are turned on for the forward direction shift mode and transmit a logical value output from the N'th unit register ResN to the (N+1)th unit register Res(N+1), as counted from the left end. The transistor Tr5 are turned on for the reverse direction shift mode and transmit a logical value output from the unit register ResN to the unit register Res(N−1). The transistors Tr6 are provided between inputs In of the unit registers on one hand and the transistors Tr4 and Tr5. Each transistor Tr6 is turned on/off by a clock anti-phase with respect to an actuating clock for the unit register of interest, so that the transistor Tr6 is turned on and off during the shift operation in the forward direction and during the shift operation of the unit register in the reverse direction, respectively. In the drawing, a signal Norm and a signal Rev are used for designating a shifting in the forward direction or in the reverse direction from outside. One of these signals is set to a HIGH level. For the shifting in the forward direction, the signal Norm is HIGH, whereas, for the shifting in the reverse direction, the signal Rev is HIGH. It is noted that signals CLK1 and CLK2 are clock signals differing in phase. These clock signals CLK1 and CLK2 are supplied so that an input signal will be alternately captured by odd-numbered unit registers and by even-numbered unit registers, respectively.

The operation of the shift register, shown in FIG. 31, will now be described with reference to FIGS. 32A and 32B. Referring to FIG. 32A, showing the shift operation in the forward direction, the unit register Res1 boosts the voltage of an input signal In1, which is in the high level state, in synchronization with the signal CLK1, to hold the signal In1 in its inside. Simultaneously, the unit register outputs a signal OUT1, as a pixel selection signal, and sets a signal Next1 to HIGH level.

FIG. 32B depicts a time chart for the shifting operation in the reverse direction. Referring to FIG. 32B, the signal Norm and the signal Rev are set, for the shifting in the reverse direction, to LOW and HIGH levels, respectively. This sets the transistor Tr5 to an on-state, while setting the transistor Tr4 to an off-state. Hence, an output signal Next of a unit register, lying on the downstream side stage in the forward direction, is entered as an input signal In to the unit register on the upstream side in the forward direction, via the transistor Tr5 in place of the transistor Tr4 in FIG. 32B.

This reverse-direction shift operation in the solid state imaging device outputs a vertically upside-down image, in case the bidirectional shift register selects the rows of the solid state imaging device.

If a camera has a rotatable display panel, the bidirectional shift register may be set to the shift operation in the forward direction in case the display panel faces the front side. In case the display apparatus panel faces the opposite side, the bidirectional shift register may be set to the shift operation in the reverse direction.

In the Patent Publications 1 and 2, the bidirectional shift registers, formed by single-channel transistors, are used. In Patent Publication 3, there is disclosed a bidirectional shift register of the CMOS configuration.

FIG. 33A shows the configuration of a shift register of a single shift direction, disclosed in Patent Publication 3, while FIG. 33B shows the configuration of a bidirectional shift register of Patent Publication 3.

With the shift register of the single shift direction, shown in FIG. 33A, the pulse entered via DX is controlled by complementary clock signals (C1, C2) to output pulses sequentially to S1 and S2.

With the bidirectional shift register, shown in FIG. 33B, bidirectional scanning is enabled by making use of shift direction control signals (L, R) to control the shift direction.

[Patent Publication 1] JP-A-2004-185684 (pages 17, 18 and FIGS. 1, 4, 5 and 6)
[Patent Publication 2] JP-A-2004-288697 (page 10, FIGS. 1, 2A and 2B)
[Patent Publication 3] JP-A-2004-134053 (page 24 and FIGS. 15A and 15B)

SUMMARY OF THE DISCLOSURE

The entire disclosures of above Patent Publications are herein incorporated by reference thereto. The following analysis is given by the present invention.

If a high added-value liquid crystal display apparatus is to be implemented with the above-described conventional configurations, the following problems are met.

For example, with the configuration disclosed in Patent Publication 1, it is necessary to provide circuit elements of the same function in duplication in order to implement bidirectional scanning. That is, transistors Tr11, Tr3 and Tr12 and Tr4 are controlled by signals P, INP and N, INN, respectively, as shown in FIG. 28. However, one of the transistor sets is activated, while the other is deactivated, depending on the scanning direction. In similar manner, one of transistors of a transistor set Tr3 and Tr14, one of transistors of a transistor set Tr15 and Tr6 and one of transistors of a transistor set Tr16 and Tr7 are activated, while the other transistors are deactivated, depending on the scanning direction. Hence, with this conventional shift register, the circuit size per bit tends to be increased.

This problem may similarly arise with the configuration disclosed in Patent Publication 2. With the configuration disclosed in Patent Publication 2, three transistors (transistors Tr4-n, Tr5-n and Tr6-n) are provided per each bit (Regn) of a shift register, as shown in FIG. 31. Moreover, the interconnections are also increased in size, with the result that the circuit size per bit is increased, as in the configuration disclosed in Patent Publication 1.

With the configuration of Patent Publication 3, it is similarly necessary to provide two clocked inverters, supplied with shift direction control signals (L, R) in FIG. 33B per each output, for shifting in the forward direction and for shifting in the reverse direction. Hence, with the configuration of Patent Publication 3, the problem again may arise that the circuit size per bit tends to be increased.

As for the configuration of the scanning circuit and that of the display apparatus, the placement pitch of pixels that make up the display apparatus is preferably equal in length-wise size to the placement pitch of the shift register that make up a scanning circuit. FIG. 34A shows an example of arrangement of a shift register with a pitch equal in length-wise size to the pitch of pixel.

The reason the pitch of pixel is to be made equal to the pitch of the shift register is apparent from the perspective of the layout of electrical interconnections that transmit signals output from the scanning circuit. Specifically, the higher the resolution of the display apparatus, the finer becomes the pitch of pixel and the narrower becomes the pitch of the smallest constituent unit of the shift register.

Referring to FIG. 34B, the narrower the pitch of the pixel 21, the longer becomes the width-wise size L of a shift register. If the number of circuit elements (area) of the shift register of FIG. 34B is equal to the number of circuit elements (area) of the shift register of FIG. 34A, the decrease in one dimension (height) of the shift register brings about the increase in another dimension (width) of the shift register.

In case the width-wise size L of the circuit increases, there is raised a problem that the frame edges of the sides of the display apparatus, along which the scanning circuits are disposed, are increased in size.

This asymmetry affects the design of the display apparatus, such that, if desired to eliminate the asymmetry, the frame edges of the display apparatus, along which the scanning circuits are not provided, need to be increased to values equal to those for the circuit width L.

It may therefore be said that, with the above-described conventional bidirectional scanning circuit, it is very difficult to achieve a narrow pitch and a narrow frame edge simultaneously.

In addition, when the bidirectional transferring function is to be provided in a shift register, there is raised a problem that the operation margin of the circuit differs with the scanning directions.

This is ascribable to the fact that, since circuit elements are provided in duplicates to provide for the bidirectional transferring function, the circuit elements or interconnections become complicated in layout. It is thus difficult to provide for symmetry in layout to provide for the bidirectional transferring function in the shift register.

If the layout is asymmetrical, the operation margin of the circuit differs with scanning in the forward or in the reverse direction. Hence, as for the characteristic of the bidirectional scanning circuit, the smaller one of the operation margins becomes the operation margin of the bidirectional scanning circuit:

This problem becomes apparent with increase in the operational frequency brought about as the definition becomes finer. In particular, if, in case the pitch of the shift register is to be narrower, the above problem is to be eliminated, the length L of the circuit shown in FIG. 34 increases to render it difficult to reduce the size of the frame edge.

It is therefore an object of the present invention to provide a bidirectional scanning circuit freed of the problem that the difference in operation margin of the circuit is produced depending on the scanning direction. It is another object of the present invention to provide a display apparatus in which the narrow pitch and the narrow fame edge width may be accomplished simultaneously and in which the display performance is prevented from being lowered in dependence upon the scanning direction.

The invention disclosed in the present application may be summarized substantially as follows:

In accordance with one aspect of the present invention, there is provided a semiconductor circuit comprising a first scanning circuit and a second scanning circuit, each of the first and second scanning circuits including a plurality of unit registers. An output of each of the unit registers of the first scanning circuit and an output of each of the unit registers of the second scanning circuit, corresponding to each other, are coupled to each other. Each of the unit registers of said first and second scanning circuits includes a circuit element that, responsive to a control signal supplied thereto, switches an output state of said each of the unit registers of said first and second scanning circuits between an output enabled state in which an output signal is output and an output disabled state in which no output signal is output. According to the present invention, during the time one of the first and second scanning circuits is outputting an output signal, the other scanning circuit is in the output disabled state.

According to the present invention, the scanning direction of the first scanning circuit is opposite to the scanning direction of the second scanning circuit.

According to the present invention, the circuit element includes a first switch circuit and a second switch circuit. The first and second switch circuits are supplied with a signal specifying the scanning direction or a signal derived from the scanning direction specifying signal, as the control signal, so as to be thereby controlled on or off. The first switch circuit is arranged in the unit register between the gate electrode of an output transistor delivering the output signal and an interconnection controlling the gate electrode. The second switch circuit is arranged between a node of the first switch circuit and the output transistor and a signal line capable of turning off the output transistor.

According to the present invention, the unit register forming the first scanning circuit and the unit register forming the second scanning circuit are similar in circuit configuration and in circuit arrangement insofar as they affect the circuit operation.

In accordance with another aspect of the present invention, there is provided a display apparatus including an array of a large number of pixels and a semiconductor circuit that activates the pixels. The pixels are controlled by an output signal delivered from a unit register of the first scanning circuit or the second scanning circuit.

In accordance with another aspect of the present invention, there is provided a method for driving a display apparatus including a first scanning circuit and a second scanning circuit arranged facing each other with a display part in-between for delivering a scanning signal from one line to another. The display part includes an array of a large number of pixels. With the method of the present invention, the second scanning circuit is in an output disabled state as long as the first scanning circuit is outputting an output signal. The first scanning circuit is in an output disabled state as long as the second scanning circuit is outputting an output signal. The scanning direction of the second scanning circuit is opposite to the scanning direction of the second scanning circuit to perform bidirectional scanning.

The meritorious effects of the present invention are summarized as follows.

With the present invention, it is possible to provide a bidirectional scanning circuit freed of the problem that the margin of the circuit operation differs between the forward and reverse scanning directions.

With the present invention, it is also possible to provide a display apparatus in which the narrow pitch and the narrow frame edge size may be accomplished simultaneously and in which the display performance may be prevented from being lowered in dependence upon the scanning directions.

Still other features and advantages of the present invention will become readily apparent to those skilled in this art from the following detailed description in conjunction with the accompanying drawings wherein examples of the invention are shown and described, simply by way of illustration of the mode contemplated of carrying out this invention. As will be realized, the invention is capable of other and different examples, and its several details are capable of modifications in various obvious respects, all without departing from the invention. Accordingly, the drawing and description are to be regarded as illustrative in nature, and not as restrictive

BRIEF DESCRIPTION OF THE DRAWINGS

FIGS. 15A and 15B are block diagrams showing the configuration of the scanning circuit according to the fourth exemplary embodiment of the present invention.

FIGS. 33A and 33B are circuit diagrams showing the configuration of a unidirectional shift register and that of a bidirectional shift register according to Patent Publication 3, respectively.

FIGS. 35A and 35B are partial block diagrams showing the configuration of a scanning circuit according to the third exemplary embodiment of the present invention.

PREFERRED MODES OF THE INVENTION

Figure 3:
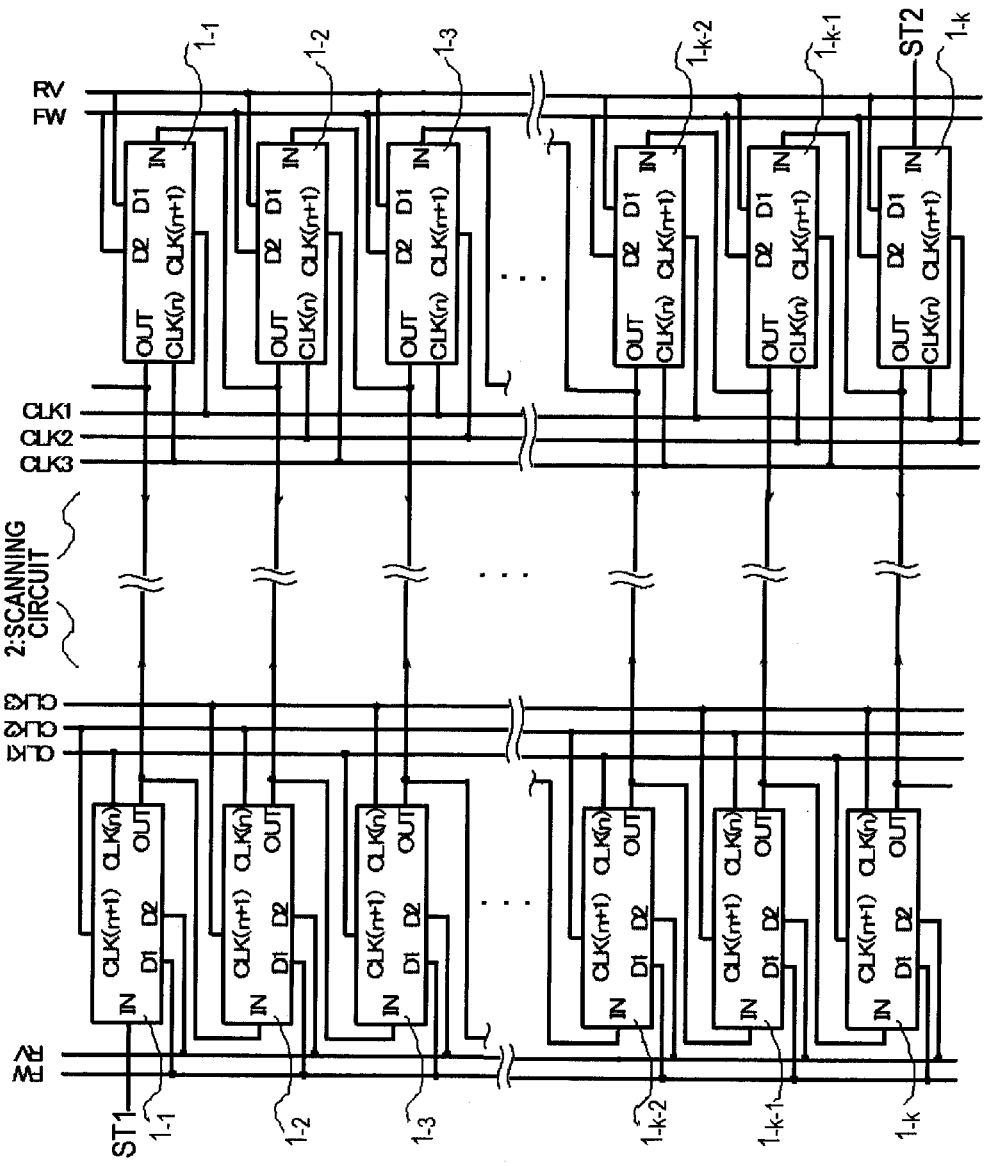
FIGS. 3A and 3B are partial block diagrams showing the configuration of a scanning circuit according to the first exemplary embodiment of the present invention.

The present invention will now be described in further detail with reference to the drawings. In the semiconductor circuit according to the present invention, there are provided a first scanning circuit (5 of FIG. 1, for example) and a second scanning circuit (6 of FIG. 1). Outputs of the first and second scanning circuits are coupled to each other. A unit register (1 of FIG. 3, for example), forming the first scanning circuit or the second scanning circuit, includes a circuit element for electrically switching an output signal between an enabled state and an output disabled state. One of the scanning circuits may be in an output disabled state, when the other scanning circuit is outputting an output signal, so that it is possible to implement a bidirectional scanning circuit that makes use of the first and second scanning circuits. A unit register is referred to as a shift register in exemplary embodiments below described.

Also, in the semiconductor circuit according to the present invention, the first scanning circuit is in an output disabled state when the second scanning circuit is outputting an output signal. Or, the second scanning circuit is in an output disabled state when the first scanning circuit is outputting an output signal. One of the scanning circuits may be in the output disabled state, when the other scanning circuit is outputting an output signal, so that it is possible to implement a display apparatus including a bidirectional scanning circuit that makes use of the first and second scanning circuits.

In the semiconductor circuit according to the present invention, the scanning direction of the first scanning circuit is opposite to that of the second scanning circuit. It is thus possible to implement a bidirectional scanning circuit with the use of the first and second scanning circuits, and a display apparatus including a scanning circuit that makes use of the first and second scanning circuits.

Figure 4:
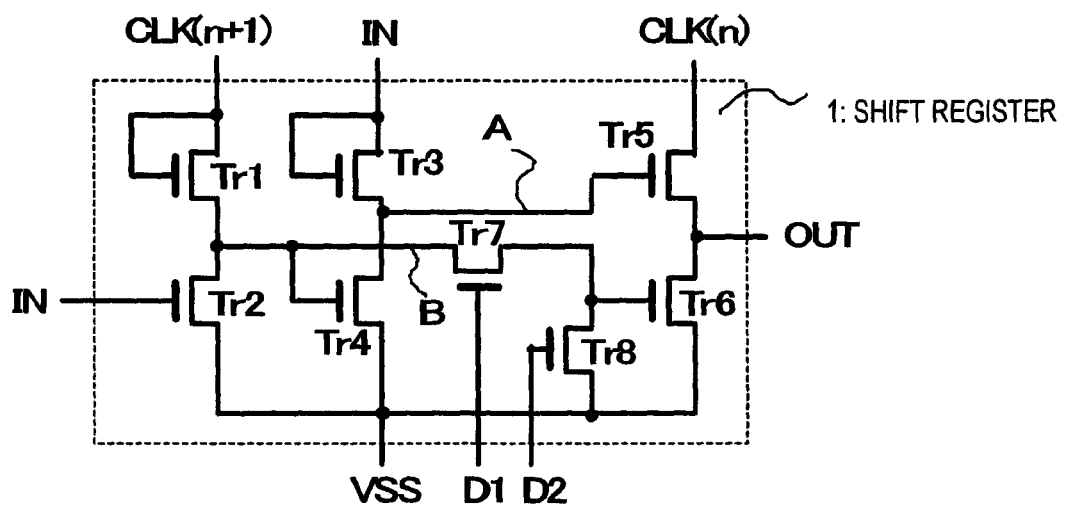
FIG. 4 is a diagram showing the circuit configuration of a scanning circuit according to the first exemplary embodiment of the present invention.

In the semiconductor circuit according to the present invention, the circuit element may include a first switch circuit (such as Tr7 of FIG. 4), and a second switch circuit (such as Tr8 of FIG. 4). The first and second switch circuits are supplied with a signal specifying the scanning direction (such as FW or RV of FIG. 3) or a signal derived from the scanning direction specifying signal, as the control signal, so as to be thereby controlled on or off. The first switch circuit is arranged in the unit register between the gate electrode of an output transistor (such as Tr6 of FIG. 4) delivering the output signal and a wiring or signal path (such as node B of FIG. 4) controlling the gate electrode of the output transistor. The second switch circuit is arranged between a node of the first switch circuit (Tr7) and the output transistor (Tr6) and a signal line (VSS) capable of turning off the output transistor (Tr6).

Thus, by setting the first and second switch circuits to an on-state or to an off-state, it is possible to control the scanning circuits to the output enabled state or to the output disabled state. More specifically, the output enabled state may be set by setting the first switch circuit (Tr7) and the second switch circuit (Tr8) on and off, respectively. The output disabled state may be set by setting the first switch circuit (Tr7) and the second switch circuit (Tr8) off and on, respectively.

In the semiconductor circuit according to the present invention, the circuit element may include first to fourth switch circuits controlled on or off by the signal specifying the scanning direction or the signal derived from the scanning direction specifying signal, as the control signal.

The first switch circuit (such as Tr7 of FIG. 10) is arranged in the unit register between the gate electrode of a first output transistor (Tr6 of FIG. 10) generating the output signal and a wiring or signal path (connection node between Tr1 and Tr2 of FIG. 10) that controls the gate electrode of a first output transistor.

The second switch circuit (Tr8 of FIG. 10) is arranged between a node between the first switch circuit (Tr7) and the first output transistor (Tr6 of FIG. 10) and a signal line (VSS) capable of turning off the first output transistor.

The third switch circuit (Tr9 of FIG. 10) is arranged between a gate electrode of a second output transistor (Tr5) generating a control signal of a potential different from the potential of the first output transistor in the unit register and a signal line (connection node between Tr3 and Tr4) controlling the gate electrode.

The fourth switch circuit (Tr10 of FIG. 10) is arranged between the node between the third switch circuit (Tr9) and the second output transistor (Tr5) and a signal line (VSS power line) capable of turning off the second output transistor. In this configuration, the first to fourth switch circuits may be set to an on-state or to an off-state to control the scanning circuits to the output enabled state or to the output disabled state.

In the semiconductor circuit according to the present invention, the circuit element may include a first switch circuit (such as Tr12 of FIG. 14) and a second switch circuit (Tr11 of FIG. 14), controlled on or off by the signal specifying the scanning direction or the signal derived from the scanning direction specifying signal, and a first output transistor (Tr6 of FIG. 14) and a second output transistor (Tr5), generating the output signal. The circuit element may also include a first signal line (VSS) for turning off the first output transistor (Tr6) and the second output transistor (Tr5), a second control signal line (CLK(n)) at a potential different from the potential of the first control signal line, and an output signal line (OUT) for transferring an output signal of the unit register.

The first switch circuit (Tr12) is provided between the output signal line (OUT) and the first control signal line. The second switch circuit (Tr11) is provided between the output signal line (OUT) and the second control signal line. It is thus possible to set the first or second switch circuit to an on-state or to an off-state to control the scanning circuit to the output enabled state or to the output disabled state.

In the semiconductor circuit according to the present invention, the circuit element may include a switch circuit (N3 of FIG. 21) controlled on or off by the signal specifying the scanning direction or the signal derived from the scanning direction specifying signal, an inverter circuit that has an output connected to an output signal line (OUT) and is made up by an NMOS transistor (N2) and a PMOS transistor (P2), a high potential power supply line (VDD) and a low potential power supply line (VSS). The output signal line (OUT) transfers an output signal of the unit register. The switch circuit (N3) is arranged between the low potential power supply line (VSS) and the inverter circuit or between the high potential power supply line (VDD) and the inverter circuit. That is, the switch circuit (N3) and the inverter circuit (P2, N2) are arranged in series between the low potential power supply line (VSS) and the high potential power supply line (VDD). Thus, by setting the switch circuit on or off, it is possible to control the scanning circuit to the output enabled state or to the output disabled state.

In the semiconductor circuit according to the present invention, the circuit element may include a first switch circuit (N3 of FIG. 25) and a second switch circuit (P3 of FIG. 25), controlled on or off by the signal specifying the scanning direction or the signal derived from the scanning direction specifying signal, an inverter circuit that has an output connected to an output signal line (OUT) and is made up by an NMOS transistor (N12) and a PMOS transistor (P12), a high potential power supply line (VDD), and a low potential power supply line (VSS). The output signal line (OUT) transfers an output signal of the unit register. The first switch circuit (N3) is arranged between the low potential power supply line (VSS) and the inverter circuit. The second switch circuit (P3) is arranged between the high potential power supply line (VDD) and the inverter circuit.

It is thus possible to set the first switch circuit and the second switch circuit to an on-state or to an off-state, respectively, to establish the output enabled state or the output disabled state, respectively.

In the semiconductor circuit according to the present invention, the circuit element may include switch circuits (P3, N3) controlled on or off by the signal specifying the scanning direction or the signal derived from the scanning direction specifying signal, and an inverter circuit made up of NMOS and PMOS transistors (P1, N1 and P2, N2). The above switch circuits are arranged between the output signal line (OUT) and an output node of the inverter circuit (connection node between P2 and N2). It is thus possible to set the first switch circuit and the second switch circuit to an on-state and to an off-state, to establish the output enabled state or the output disabled state.

In a further aspect of the present invention, there is provided a display apparatus having an array of a large number of pixels and a semiconductor circuit that activates the pixels. The pixels are controlled by an output signal delivered from a unit register of the first scanning circuit (5) or the second scanning circuit (6). The first and second scanning circuits have a common output. The circuit element that switches an output state between the output enabled state and the output disabled state is provided within the unit register of the first and second scanning circuits. It is thus possible to disable the outputting operation of one of the scanning circuits while the other scanning circuit is performing an outputting operation, and hence to provide a display apparatus that makes use of the first and second scanning circuits.

Figure 8:
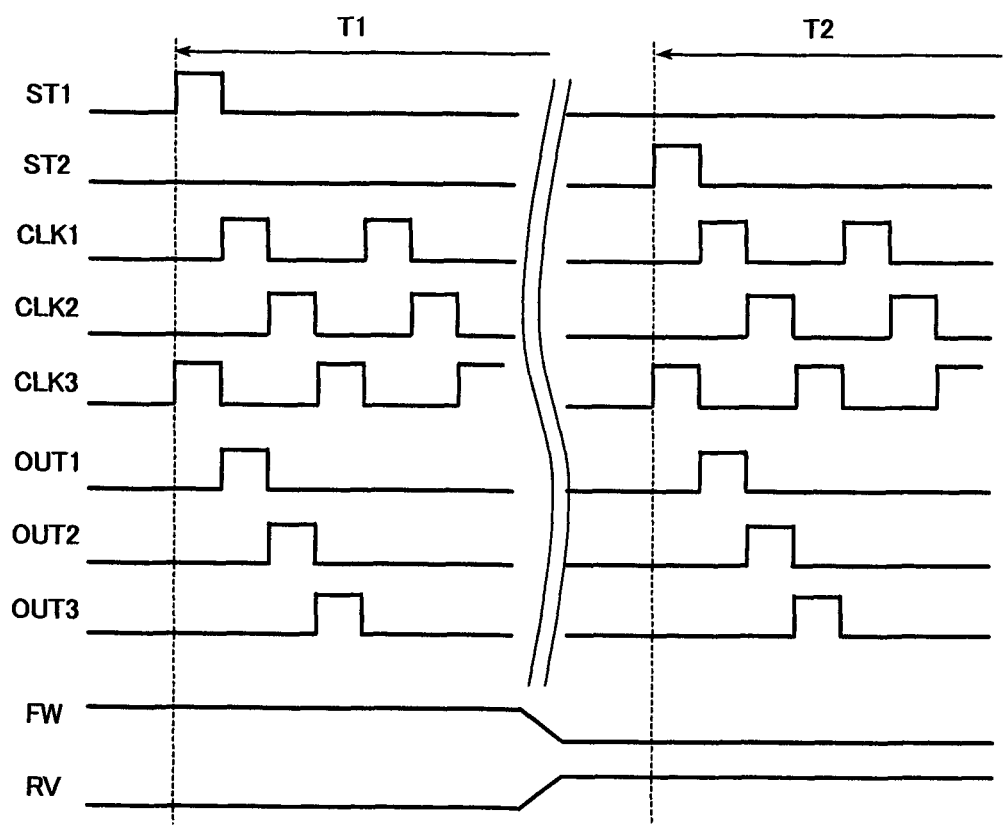
FIG. 8 is a timing chart for illustrating the operation of the first exemplary embodiment of the present invention.

With the driving method for a semiconductor circuit, according to the present invention, the second scanning circuit is controlled to be in an output disabled state when the first scanning circuit is outputting an output signal. Or, the first scanning circuit is controlled to be in the output disabled state when the second scanning circuit is outputting an output signal (FIG. 8). Hence, one of the scanning circuits may be in the output disabled state when the other scanning circuit is delivering the output signal, so that it is possible to implement a scanning circuit formed by the first and second scanning circuits.

With the driving method for a display apparatus, according to the present invention, the second scanning circuit is controlled to be in the output disabled state when the first scanning circuit is outputting an output signal. Or, the first scanning circuit is controlled to be in the output disabled state when the second scanning circuit is outputting an output signal. Hence, one of the scanning circuits may be in the output disabled state when the other scanning circuit is delivering the output signal, so that it is possible to implement a display apparatus that makes use of the first and second scanning circuits.

Further, with the semiconductor circuit or the display apparatus, according to the present invention, the unit register forming the first scanning circuit and the unit register forming the second scanning circuit are similar in circuit configuration and in circuit arrangement insofar as they affect the circuit operation. It is thus possible to prevent the difference between the operational characteristics of the first scanning circuit and those of the second scanning circuit from being produced, as well as to prevent the display performance from being deteriorated depending on the scanning direction in the display apparatus having the first and second scanning circuits.

Additionally, with the semiconductor circuit or the display apparatus according to the present invention, the scanning direction of the first scanning circuit is opposite to that of the second scanning circuit. It is thus possible to implement the bidirectional scanning circuit with the use of the first and second scanning circuits, and a display apparatus including the bidirectional scanning circuit that makes use of the first and second scanning circuits.

Moreover, with the semiconductor circuit or the display apparatus according to the present invention, the first and second scanning circuits may be formed by NMOS or PMOS transistors. With these transistors, the cost of fabrication of transistor substrates may be suppressed as compared to the case of CMOS transistors, so that the semiconductor circuit or the display apparatus may be fabricated at lower costs. According to the present invention, the transistors of the scanning circuits may be fabricated by the same process as that for fabricating pixel transistors (TFTs) of the pixel panel, such as amorphous silicon TFTs or polysilicon TFTs.

Further, with the semiconductor circuit or the display apparatus, according to the present invention, the first and second scanning circuits may be formed by a CMOS process. In this case, the output of the scanning circuit may be selected to a voltage value of a wide gamut ranging from the voltage of the low potential power supply to that of the high potential power supply. The present invention is now described with reference to preferred exemplary embodiments.

First Exemplary Embodiment

Figure 1:
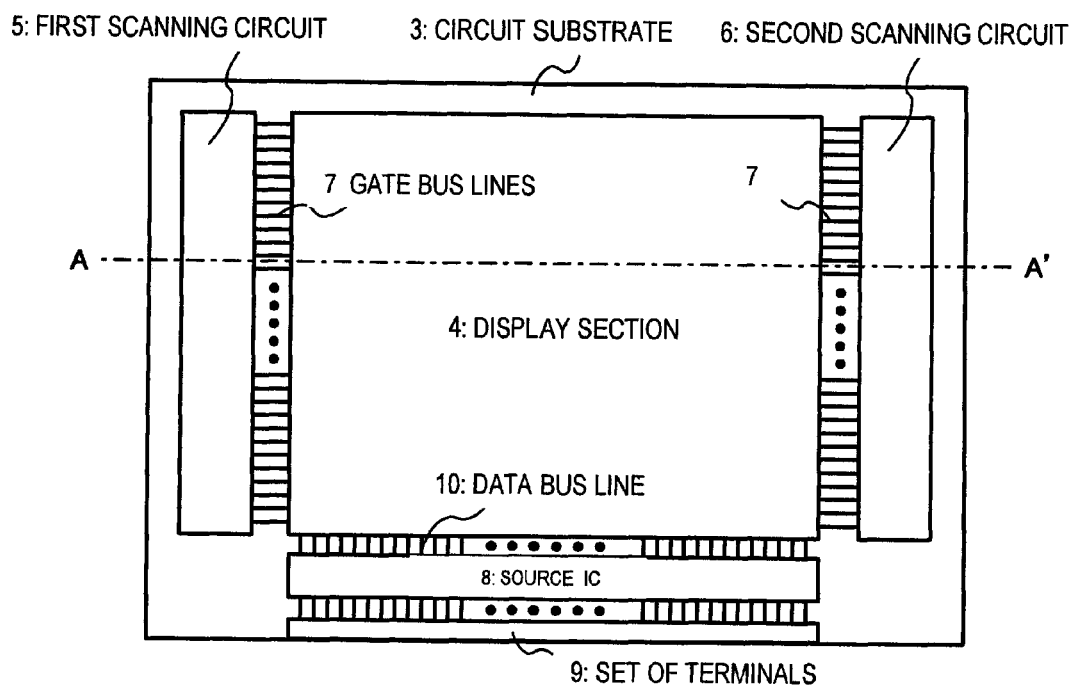
FIG. 1 is a schematic plan view showing the configuration of a display of an exemplary embodiment of the present invention.
Figure 2:
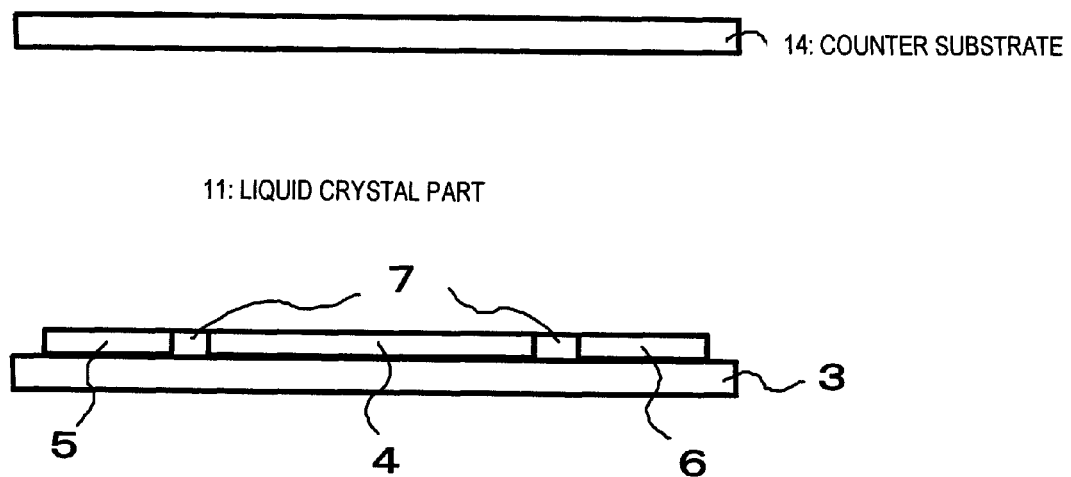
FIG. 2 is a schematic cross-sectional view showing a display according to a first exemplary embodiment of the present invention.
Figure 5:
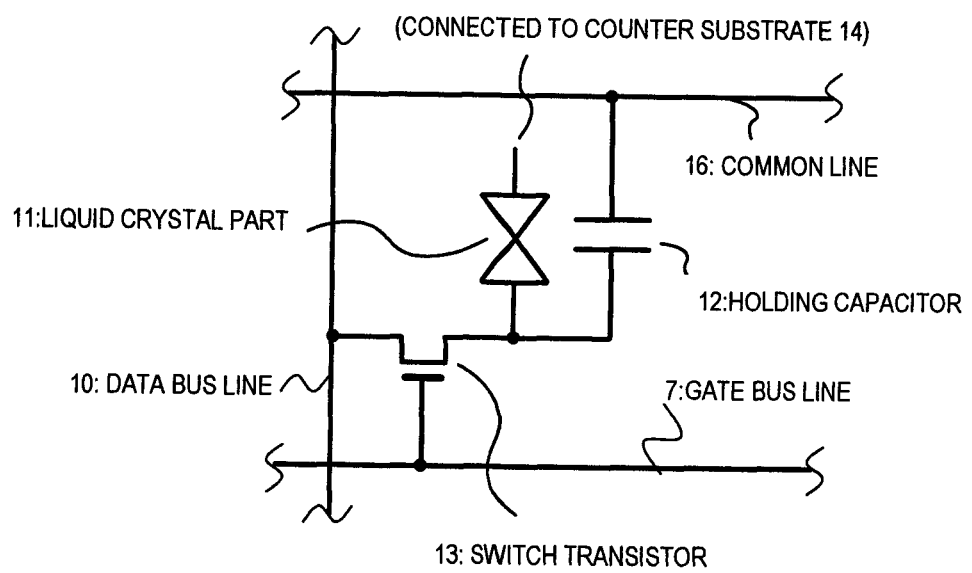
FIG. 5 is a diagram showing the circuit configuration of a pixel part of the display according to the first exemplary embodiment of the present invention.

A first exemplary embodiment of the present invention will now be described. FIG. 1 schematically shows a display of the present exemplary embodiment. FIG. 2 is a schematic cross-sectional view taken along line A-A' of FIG. 1. FIGS. 3A and 3B are block diagrams showing the configuration of a scanning circuit of the present exemplary embodiment. FIG. 4 is a circuit diagram showing the configuration of a shift register of the present exemplary embodiment, and FIG. 5 is a circuit diagram showing a pixel part of the display of the present exemplary embodiment.

Referring to FIG. 1, a display of the present exemplary embodiment includes a circuit substrate 3, on which there are mounted a display section 4, a first scanning circuit 5, a second scanning circuit 6, gate bus lines 7, a source IC 8, a set of terminals 9 and data bus lines 10. A large number of pixels, one of which is shown in FIG. 5, are arrayed on the display section 4.

Referring to FIG. 2, the display of the present exemplary embodiment includes the circuit substrate 3, a counter substrate 14 and a liquid crystal layer (liquid crystal part) 11. The liquid crystal layer 11 is sandwiched between the circuit substrate 3 and the counter substrate 14 via a gap control means, not shown.

The first and second scanning circuits are arranged as shown in FIGS. 3A and 3B, respectively. These scanning circuits are controlled by a set of interconnections, that is, by CLK1, CLK2, CLK3, ST1 or ST2, FW and RV.

The gate bus lines 7 interconnect outputs of the first scanning circuit 5 and those of the second scanning circuit 6.

Referring to FIG. 4, a unit register 1 of a shift register of the present exemplary embodiment includes transistors Tr1 to Tr8, and a set of terminals IN, CLK(n), CLK(n+1), OUT, VSS, D1 and D2.

More specifically, the shift register (unit register) 1, shown in FIG. 4, includes the NMOS transistors Tr1 to Tr8. Of these, the NMOS transistor Tr1 has a gate and a drain connected to the clock terminal CLK(n+1), and the NMOS transistor Tr2 has a drain connected to a source of the NMOS transistor Tr1, while having a gate connected to a terminal IN and having a source connected to VSS. The NMOS transistor Tr3 has a gate and a drain connected to the terminal IN, and the NMOS transistor Tr4 has a drain connected to a source of the NMOS transistor Tr3 (node A), while having a gate connected to the drain of the NMOS transistor Tr2 (node B) and having a source connected to VSS. The NMOS transistor Tr5 has a drain connected to the clock (n) terminal, while having a gate connected to a source of the NMOS transistor Tr3 (node A) and having a drain connected to a terminal OUT, and the NMOS transistor Tr6 has a drain connected to the terminal OUT, while having a source connected to VSS. The NMOS transistor Tr7 is connected between the drain of the NMOS transistor Tr2 and the gate of the NMOS transistor Tr6, and has a gate connected to the terminal D1, and the NMOS transistor Tr8 has a drain connected to the gate of the NMOS transistor Tr6, while having a gate connected to the terminal D2 and having a source connected to VSS.

The transistor Tr1 receives a HIGH level signal of CLK(n+1) to deliver a HIGH level (in actuality, a voltage corresponding to the HIGH level minus the threshold voltage of the transistor Tr1) to the node B.

The transistor Tr2 receives a potential at the terminal IN (or a potential at the terminal OUT of the previous stage) at its gate and is thereby turned on to set the potential at the node B so as to be equal to VSS.

The transistor Tr3 receives a potential at the terminal IN (or a potential at OUT of the previous stage) at its gate to provide a HIGH level (in actuality, a voltage corresponding to the HIGH level minus the threshold voltage of the transistor Tr3) to the node A.

The transistor Tr4 receives a potential at the node B at its gate and, in case the node B is at a HIGH level (that is, in case the transistor Tr1 is ON and the transistor Tr2 is OFF), the transistor Tr4 provides the voltage VSS to the node A.

The transistor Tr5 receives the potential at the node A at its gate and is thereby turned on to provide a clock signal CLK(n) to the terminal OUT.

The transistor Tr6 receives the potential at the node B at its gate and, when the node B is at a HIGH level, sets the potential at the terminal OUT to the voltage VSS.

The transistor Tr7 receives the signal D1 at its gate and is thereby controlled on or off. When in an off state, the transistor Tr7 disconnects the gate of the transistor Tr6 and the node B from each other. The node B is a connection node between the gate of the transistor Tr4 on one hand and the source of the transistor Tr1 and the drain of the transistor Tr2 on the other hand.

The transistor Tr8 receives the signal D2 at its gate and is thereby controlled on or off. When in the on-state, the transistor Tr8 shorts the gate of the transistor Tr6 to VSS.

Referring to FIG. 3A, in the first scanning circuit 5, the terminals CLK(n) and CLK(n+1) of the first-stage shift register 1_1 are connected to CLK1 and CLK2, respectively.

The terminals CLK(n) and CLK(n+1) of the second-stage shift register 1_2 are connected to CLK2 and CLK3, respectively.

The terminals CLK(n) and CLK(n+1) of the third-stage shift register 1_3 are connected to CLK3 and CLK1, respectively.

The terminals CLK(n) and CLK(n+1) of the following register stages are connected in a similar manner. In FIG. 3A, first three stages and last three stages of shift registers are shown. As for the last three stages, the terminals CLK(n) and CLK(n+1) of the (k−2)th-stage shift register 1_k−2 (where k is a multiple of 3) are connected to CLK1 and CLK2, respectively. The terminals CLK(n) and CLK(n+1) of the (k−1)th-stage shift register 1_k−1 are connected to CLK2 and CLK3, respectively. The terminals CLK(n) and CLK(n+1) of the kth-stage shift register 1_k are connected to CLK3 and CLK1, respectively.

Referring to FIG. 3B, in the second scanning circuit 6, the terminals CLK(n) and CLK(n+1) of the third-stage shift register 1_3 are connected to CLK3 and CLK1, respectively. The terminals CLK(n) and CLK(n+1) of the second-stage shift register 1_2 are connected to CLK2 and CLK3, respectively. The terminals CLK(n) and CLK(n+1) of the first-stage shift register 1_3 are connected to CLK1 and CLK2, respectively. The terminals CLK(n) and CLK(n+1) of the following register stages are connected in a similar manner. The terminals CLK(n) and CLK(n+1) of the (k−2)th-stage shift register 1_k−2 are connected to CLK3 and CLK1, respectively. The terminals CLK(n) and CLK(n+1) of the (k−1)th-stage shift register 1_k−1 are connected to CLK2 and CLK3, respectively. The terminals CLK(n) and CLK(n+1) of the kth-stage shift register 1_k are connected to CLK1 and CLK2, respectively.

The terminals CLK(n) and CLK(n+1) of the second-stage shift register 1 are connected to CLK2 and CLK3, respectively.

The terminals CLK(n) and CLK(n+1) of the third-stage shift register 1 are connected to CLK3 and CLK1, respectively.

ST1 and ST2 are control signals for starting the shift operation, and are supplied to the terminal IN of the shift register 1_1 at the uppermost row of FIG. 3A and to the terminal IN of the shift register 1_n at the lowermost row of FIG. 3B, respectively.

The signal ST1 is supplied to the first scanning circuit 5, while the signal ST2 is supplied to the second scanning circuit 6.

The IN terminals of the succeeding stages of the shift register are supplied with signals OUT of the respective previous stages.

FW and RV are control signals that prescribe the scanning direction, and are coupled to the terminals D1 and D2 of the shift register 1, respectively. It should be noticed that the states of connection of the control signals to the first and second scanning circuits 5, 6 differ from each other.

That is, terminals D1 and D2 of the first scanning circuit 5 are coupled to the signals FW and RV, respectively, while the terminals D2 and D1 of the second scanning circuit 6 are coupled to the signals FW and RV, respectively.

The scanning direction of the first scanning circuit 5 and that of the second scanning circuit 6 are opposite to each other. For example, with the first scanning circuit 5, the signal ST1 is supplied to the terminal IN of the shift register 1_1, and the scanning direction is downward in FIG. 3A. Conversely, with the second scanning circuit 6, the signal ST2 is supplied to the terminal IN of the shift register 1_k, and the scanning direction is upward in FIG. 3B.

In an example of FIG. 5, the pixel is provided with a switching transistor 13, a liquid crystal part (capacitor of the liquid crystal part) 11 and a holding capacitor 12.

The switching transistor 13 has a gate part coupled to the bus line 7, while having a source-drain part connected to an electrode of the capacitor of the liquid crystal part 11 and to an electrode of the holding capacitor 12.

The other electrodes of the capacitor of the liquid crystal part 11 and the holding capacitor 12 are electrically connected to the counter substrate.

The source IC 8 is a circuit for receiving video display data signals, supplied thereto from an externally connected device, not shown, via the set of terminals 9. The source IC 8 delivers the so received signals to the data bus lines 10.

The source IC 8 is made up of an IC chip. The chip of the source IC 8 is COG (Chip On Glass)-mounted on the circuit substrate 3 and electrically connected to the circuit substrate 3.

Thus, in the present exemplary embodiment, the first scanning circuit 5 and the second scanning circuit 6 are mounted on either sides of the display section 4, with the scanning directions of the first scanning circuit 5 and the second scanning circuit 6 being opposite to each other.

The operation of the first exemplary embodiment will now be described. Referring to FIG. 1, the operation of the display of the present first exemplary embodiment is described in the below.

One of the first scanning circuit 5 and the second scanning circuit 6 performs an outputting operation, with the other halting its outputting operation.

The scanning directions of the scanning circuits are opposite to each other. If the scanning direction of the first scanning circuit 5 is the downward direction in FIG. 1, the scanning direction of the second scanning circuit 6 is the upward direction in FIG. 1.

The output signals of the scanning circuits are transferred to associated gate bus lines 7, so that pixels of the display section 4 connected to the gate bus lines 7 are all in activated states.

The video signals, output from the externally connected device, are transferred to the data bus lines 10 via the set of terminals 9 and the source IC 8.

In this state, the video signals, transferred via the associated data bus lines 10, are supplied to the pixels in the activated state. The pixels control the transmittance of light, not shown, in accordance with input video signals.

By the repetition of the above operation, the scanning circuit sequentially drives the gate bus lines 7. All of the gate bus lines 7 are selected within one frame period, and the video signals, associated with the pixels, connected to the gate bus lines, are supplied to the pixels, whereby the display state of all pixels may be modified within one frame period.

Thus, by transitioning from one display state to the next, for every frame period, it is possible for the display section 4 to fulfill its function.

The operation of the scanning circuit, more specifically, the operation of the shift register, made up of a plural number of NMOS transistors, as shown in FIG. 4, will be now described.

FIG. 8 is a timing chart for illustrating the operation of the present exemplary embodiment. With the display of the present exemplary embodiment, as long as the first scanning circuit 5 delivers a gate signal, driving the switching transistor 13 of each pixel, to the gate bus line 7, the second scanning circuit 6 halts outputting to the gate bus line 7.

Conversely, as long as the second scanning circuit 6 is performing its driving operation, the first scanning circuit 5 halts its outputting. This role is performed by the transistors Tr7 and Tr8 and the signals FW and RV.

The timing chart of FIG. 8 is in two parts, one being for the period (T1) of driving by the first scanning circuit 5 and the other being for the period (T2) of driving by the second scanning circuit 6.

During the period T1, the signals FW and RV are kept HIGH and LOW, respectively. This means that the transistors Tr7 and Tr8 of each shift register 1 of the first scanning circuit 5 are kept in the on-state and in the off-state, respectively.

If, in this state, the HIGH level of the signal ST1 is supplied to the terminal In of the first shift register of the first scanning circuit 5, the gate of the transistor Tr2 transitions to its on-state. A LOW level is set at the node B. At the same time, the transistor Tr3 is activated, so that a HIGH level is set at the node A. In actuality, this HIGH level corresponds to a HIGH level minus the threshold voltage of the transistor Tr3.

If, in this state, the HIGH level of the signal ST1 transitions to the LOW level, and the clock signal CLK1 transitions from the LOW level to the HIGH level, the potential at the node A rises under the bootstrap effect. The HIGH level of the signal CLK1 is thus supplied to OUT1 without being lowered. It should be noticed that the OUT1 is the output OUT of the first shift register of FIG. 3A.

Since the connection line of the output OUT1 is connected to the terminal IN of the second-stage shift register, the output signal at the output OUT1 has transitioned to the HIGH level. The operating state of the second-stage unit register is similar to that of the first-stage unit register supplied with the signal ST1.

When the HIGH level of the output OUT1 has transitioned to the LOW level, and the signal CLK2 has transitioned from the LOW level to the HIGH level, the output OUT2 of the second-stage shift register also transitions to the HIGH level.

The output OUT2 performs the role of a start signal for the third unit register, such that, by the signal CLK3, the output OUT3 similarly transitions to the HIGH level.

In this manner, the shift register delivers an output signal at the output OUT, at the same time as it transmits the output signal to the next stage unit register, thus performing the driving of providing outputs shown by waveforms OUT1, OUT2, OUT3 and so forth, as indicated in the timing chart.

The shift registers 1 in the second scanning circuit 6 are all kept in inactivated states because the signal ST2 is kept LOW, the signal FW is kept HIGH and the signal RV is kept LOW.

Since the transistor Tr7 is in an off state and the transistor Tr8 is in an on state, a LOW level is applied to the gate of the transistor Tr6 and hence the transistor Tr6 is turned off.

Since the node A is at LOW level, the transistor Tr5 is in an off state.

The first scanning circuit 5 is activated, the gate bus line 7 connected to the terminal OUT also transitions to the HIGH level at the same time as the corresponding terminal OUT of the shift register goes to the HIGH level.

At this time, the transistor Tr6 of the shift register of the second scanning circuit 6, which shares the gate bus line 7 with the first scanning circuit 5, is kept in its off-state. It is thus possible to prevent the steady-state current from flowing to the VSS power supply side via the transistor Tr6.

During the period T2, the gate signal is supplied from the second scanning circuit 6 to the gate bus line 7. Conversely, the supply of the output from the first scanning circuit 5 to the gate bus line 7 is disabled. That is, the driving method of the first scanning circuit 5 during the period T1 may directly be used for driving by the second scanning circuit 6, while the driving method of the second scanning circuit 6 during the period T1 may directly be used for driving by the first scanning circuit 5.

With the present exemplary embodiment, described above, it is possible to implement a display including a bidirectional scanning circuit that makes use of NMOS transistor circuits. With the present exemplary embodiment, the first and seconds scanning circuits may be symmetrically arranged on opposing sides of the substrate with the display section disposed therebetween to implement a bidirectional scanning in which the operation margins between the forward scanning and the reverse scanning may be equalized, thereby enabling to cope with a high speed operation. Further, since the shift register composing the respective scanning circuits may be configured to have a relatively narrow circuit width even with a narrow pixel pitch, the narrow frame edge of the display unit may be accomplished without the operation speed being lowered in dependence upon the scanning directions.

Second Exemplary Embodiment

Figure 6:
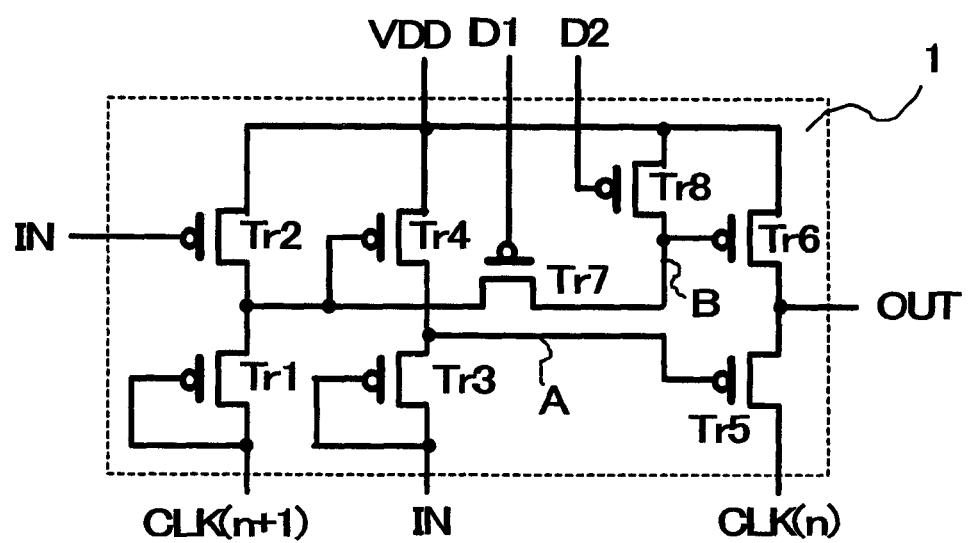
FIG. 6 is a diagram showing the circuit configuration of a shift register of the PMOS configuration according to a second exemplary embodiment of the present invention.

A second exemplary embodiment of the present invention will be now described. Similarly to the first exemplary embodiment, the display of the present second exemplary embodiment has the configuration shown in FIGS. 1 and 2. However, the pixels that make up the display section 4 are each formed by PMOS transistors as shown in FIG. 6. These PMOS transistors are labeled Tr1 to Tr8. Of these, the PMOS transistor Tr1 has a gate and a drain connected to a terminal CLK(n+1), and the PMOS transistor Tr2 has a drain connected to a source of the PMOS transistor Tr1, while having a gate connected to a terminal IN and having a source connected to VDD. The PMOS transistor Tr3 has a gate and a drain connected to the terminal IN, and the PMOS transistor Tr4 has a drain connected to a source of the PMOS transistor Tr3 (node A), while having a gate connected to the drain of the PMOS transistor Tr2 (node B) and having a source connected to VDD. The PMOS transistor Tr5 has a drain connected to the terminal CLK(n), while having a gate connected to a source of the PMOS transistor Tr3 (node A) and having a drain connected to a terminal OUT. The PMOS transistor Tr6 has a drain and a source connected to the terminal OUT and to VDD, respectively. The PMOS transistor Tr7 is connected between the drain of the PMOS transistor Tr2 and the gate of the PMOS transistor Tr6 and has a gate connected to the terminal D1. The PMOS transistor Tr8 has a drain connected to the gate of the PMOS transistor Tr6, while having a gate connected to the terminal D2 and having a source connected to VSS.

Similarly to the first exemplary embodiment, the present exemplary embodiment of the scanning circuit has a configuration shown in FIGS. 3A and 3B.

In the present exemplary embodiment, the shift register, forming the scanning circuit, differs in configuration from that of the first exemplary embodiment. The configuration of the shift register of the present exemplary embodiment will now be described with reference to FIG. 6.

FIG. 6 is a circuit diagram showing the configuration of a shift register 1 formed by PMOS transistors.

Referring to FIG. 6, the shift register 1 of the second exemplary embodiment includes transistors Tr1 to Tr8 and terminals IN, CLK(n), CLK(n+1), OUT, VSS, D1 and D2.

The transistor Tr1 receives a LOW level of the clock signal CLK(n+1) to transfer the LOW level to the node B. In actuality, the LOW level provided to the node B is higher than the LOW level by the threshold voltage of the transistor Tr1.

The transistor Tr2 receives a signal IN (or a signal OUT of the previous stage) to provide the voltage VDD to the node B.

The transistor Tr3 receives a signal IN (or a signal OUT of the previous stage) to provide the LOW level to the node A. In actuality, the LOW level provided to the node A is higher than the LOW level by a threshold voltage of the transistor Tr3.

The transistor Tr4 is controlled on or off by the potential of the node B to transmit the voltage VDD to the node A.

The transistor Tr5 is controlled by the potential at the node A to deliver a clock signal CLK(n) to OUT.

The transistor Tr6 is controlled by the potential at the node B to change the potential at the terminal OUT to the voltage VDD.

The transistor Tr7 receives the signal D1 to disconnect the gate of the transistor Tr6 from the gate of the transistor Tr4 and from the source and the drain of the transistors Tr1 and Tr2.

The transistor Tr8 receives the signal D2 to short the gate of the transistor Tr6 and VDD.

The operation of the display of the present second exemplary embodiment is similar to that of the first exemplary embodiment described above. The operation of the scanning circuit of the present exemplary embodiment will be now described with reference to the timing chart of FIG. 9.

Figure 9:
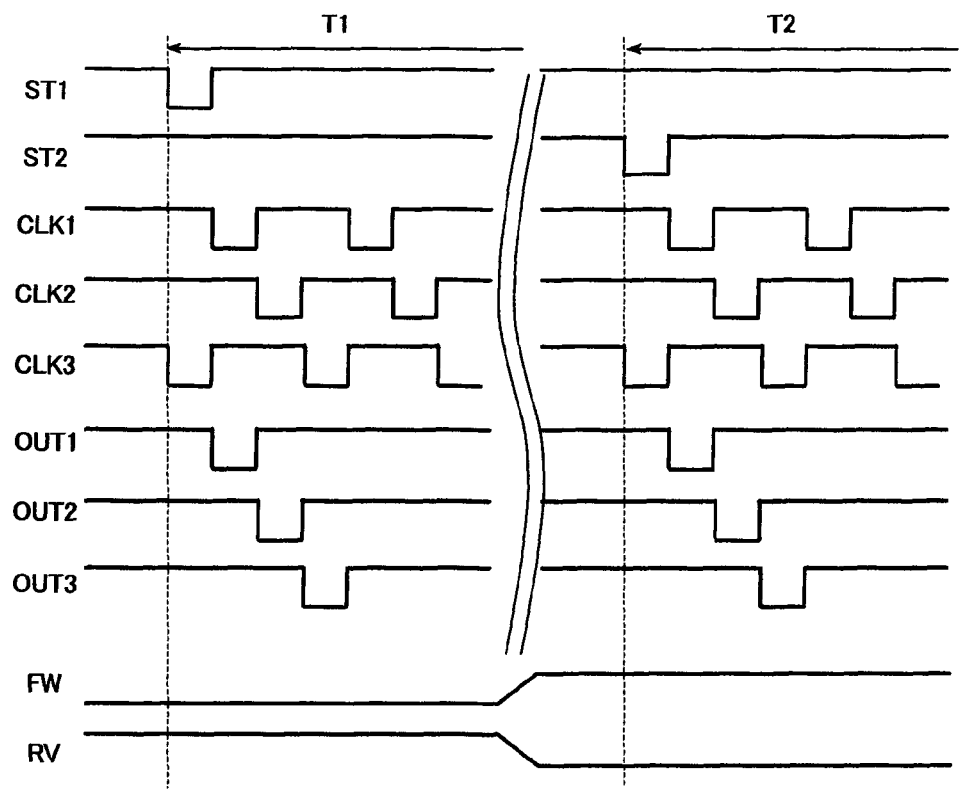
FIG. 9 is a timing chart for illustrating the operation of the second exemplary embodiment of the present invention.

This timing chart of FIG. 9 is in two parts, one being for the period (T1) of driving by the first scanning circuit 5 and the other being for the period (T2) of driving by the second scanning circuit 6.

During the period T1, the signals FW and RV are kept LOW and HIGH, respectively. That is, the transistors Tr7 and Tr8 of each shift register 1 of the first scanning circuit 5 are kept in the on-state and in the off-state, respectively. If, in this state, the LOW level of the signal ST1 is supplied to the terminal IN of the first-stage shift register of the first scanning circuit 5, the gate of the transistor Tr2 transitions to an on-state to apply a HIGH level to the node B. At the same time, the transistor Tr3 is activated, so that the LOW level is supplied to the node A. In actuality, the voltage supplied to the node A is higher than the LOW level by a threshold voltage of the transistor Tr3.

If, in this state, the level of the signal ST1 transitions to the LOW level, and CLK1 transitions from the HIGH level to the LOW level, the potential at the node A is decreased, under the bootstrap effect, and hence the LOW level of CLK1 is transferred without voltage increase to OUT1.

Since the signal line of the output OUT1 is connected to the terminal IN of the second-stage shift register 1, the output signal at the output OUT1 transitioning to the HIGH level represents a state similar to the state the signal ST1 has been delivered to the first stage. When OUT1 has transitioned from the LOW level to the HIGH level, and CLK2 has transitioned from the HIGH level to the LOW level, the output OUT2 of the second-stage shift register 1 similarly transitions to the LOW level. The output OUT2 performs the role of a start signal for the third stage, such that the output OUT3 also transitions to the LOW level by CLK3.

In this manner, the shift register sequentially delivers an output signal at the terminal OUT, while transmitting the output signal to the next stage unit register, thus performing the driving of providing the waveforms OUT1, OUT2, OUT3 and so forth, as indicated in the timing chart.

During this time, ST2, FW and RV in the second scanning circuit 6 are kept HIGH, LOW and HIGH, respectively, and hence the shift registers 1 of the second scanning circuit 6 are all kept in deactivated states. In particular, since the transistors Tr7 and Tr8 are kept in the off-state and in the on-state, respectively, and hence the gate of the transistor Tr6 is set to the HIGH level at all times. The transistor Tr6 is thus kept in off-state at all times.

On the other hand, the signal ST2 is HIGH and hence no LOW level signal is supplied to the terminal IN. Hence, the gate of the transistor Tr5 is kept HIGH at all times, so that the transistor Tr5 is in an off-state.

Since the first scanning circuit 5 is in a driving state, the gate bus line 7, connected to the terminal OUT of the shift register 1 of interest goes LOW, at the same time as the terminal OUT goes LOW. At this time, the transistor Tr6 of the shift register 1 of the second scanning circuit 6, which shares the gate bus line 7 with the first scanning circuit 5, is kept in its off-state. It is thus possible to prevent the steady-state current from flowing to the VSS power supply side via the transistor Tr6.

During the period T2, the second scanning circuit 6 is in the driving operation, while the operation of the first scanning circuit 5 is disabled. That is, the driving method by the first scanning circuit 5 during the period T1 may directly be used for driving by the second scanning circuit 6, while the driving method by the second scanning circuit 6 during the period T may directly be used for driving by the first scanning circuit 5.

With the present exemplary embodiment, described above, it is possible to implement a display including a bidirectional scanning circuit that makes use of PMOS transistor circuits.

Third Exemplary Embodiment

A third exemplary embodiment of the present invention will now be described. Similarly to the above-described first exemplary embodiment, the display of the present exemplary embodiment has a configuration similar to that shown in FIGS. 1 and 2. However, the pixels that make up the display section 4 are as shown in FIG. 5. The configuration of the scanning circuit is as shown in FIGS. 35A and 35B.

Referring to FIGS. 35A and 35B, in the present exemplary embodiment, the start signals ST1 and ST2 in FIGS. 3A and 3B, are the same common signal ST. That is, the same start signal ST is used common as ST1 and ST2. Signals FW and RW specifying the scanning direction in FIGS. 3A and 3B are replaced a signal D and /D which is a complementary signal of the signal D.

The present exemplary embodiment differs from the first exemplary embodiment as to the configuration of the shift register that makes up the scanning circuit. The configuration of the shift register of the present exemplary embodiment will now be described with reference to FIG. 10.

Figure 10:
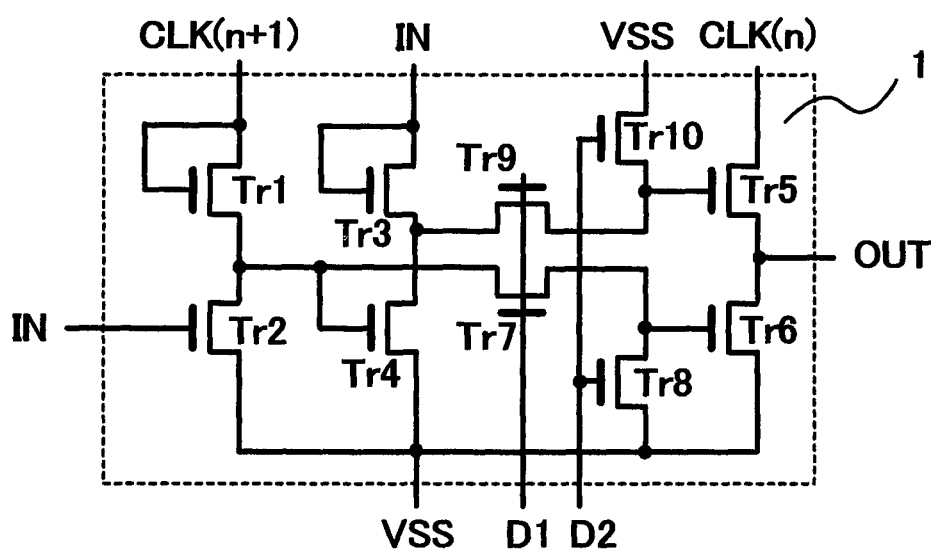
FIG. 10 is a diagram showing a circuit configuration of a register part of a shift register according to the first exemplary embodiment of the present invention.

FIG. 10 is a circuit diagram showing the configuration of the shift register 1 made up of NMOS transistors. Referring to FIG. 10, the shift register includes the NMOS transistors Tr1 to Tr8. Of these, the NMOS transistor Tr1 has a drain and a gate connected to CLK(n+1), and the NMOS transistor Tr2 has a drain connected to a source of the transistor Tr1, while having a gate connected to a terminal IN and having a source connected to VSS. The NMOS transistor Tr3 has a drain and a gate connected to the terminal IN, and the NMOS transistor Tr4 has a drain connected to a source of the transistor Tr3, while having a gate connected to a connection node between the source of the transistor Tr1 and the drain of the transistor Tr2 and having a source connected to VSS. The NMOS transistor Tr5 has a drain connected to the terminal CLK(n), while having a source connected to a terminal OUT, and the NMOS transistor Tr6 has a drain connected to the terminal OUT, while having a source connected to VSS. The NMOS transistor Tr9 is connected between the source of the transistor Tr3 and a gate of the transistor Tr5, and has the gate connected to the terminal D1. The NMOS transistor Tr7 is connected between the connection node between the source of the transistor Tr1 and the drain of the transistor Tr2 and a gate of the transistor Tr6, and has a gate connected to the terminal D1. The NMOS transistor Tr8 has a drain connected to the gate of the transistor Tr6, while having a gate connected to the terminal D2. The NMOS transistor Tr10 has a drain connected to the gate of the transistor Tr5, while having a source connected to VSS and having a gate connected to the terminal D2.

The transistors Tr1 to Tr8 are the same as the corresponding transistors of the above-described first exemplary embodiment insofar as the circuit configuration is concerned. The transistor Tr9 receives the signal D1 at its gate to isolate the transistor Tr5 from the source/drain of the transistors Tr3 and Tr4. The transistor Tr10 receives the signal D2 at its gate to short the gate of the transistor Tr5 and VSS.

This shift register 1 has a configuration in which transistors Tr9 and Tr10 are added to the configuration of the first exemplary embodiment. However, since the interconnections used are VSS, D1 and D2 in the first exemplary embodiment, the terminal structure is in no way different from that of the first exemplary embodiment.

Figure 12:
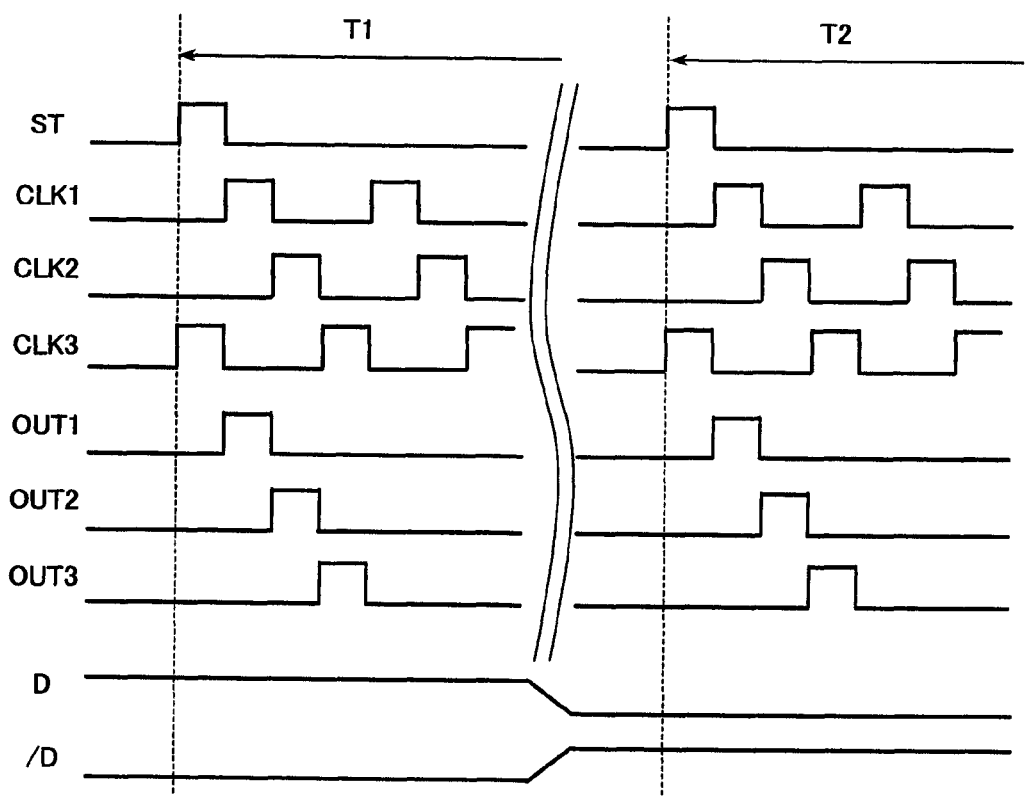
FIG. 12 is a timing chart for illustrating the operation of the scanning circuits according to third and fifth exemplary embodiments of the present invention.

FIG. 12 is a timing chart for illustrating the operation of the third exemplary embodiment. In the present third exemplary embodiment, the same signal is supplied as the start signal ST to both the first and second scanning circuits 5 and 6.

Similarly to the transistors Tr7 and Tr8, the transistors Tr9, Tr10 have gates connected to D1, D2, respectively. Hence, the operation of the transistors Tr9, Tr10 is in no way different from that of the transistors Tr7 and Tr8 described in connection with the first exemplary embodiment.

With the present third exemplary embodiment, the outputting operation by the second scanning circuit 6 is disabled as long as the first scanning circuit 5 is performing its outputting operation. On the other hand, the outputting operation by the first scanning circuit 5 is disabled as long as the second scanning circuit 6 is performing its outputting operation.

The transistors Tr7 and Tr9 of the shift register 1, performing its outputting operation, are in an on-state, while the transistors Tr8 and Tr9 are in an off-state.

On the other hand, the transistors Tr7 and Tr9 of the shift register 1 in the output disabled state are off, while the transistors Tr8 and Tr10 are on. Thus, even though the transistors Tr5 and Tr6 are both off, and the start signal ST is supplied to the shift register 1 in the output disabled state, no signal is output to the terminal OUT. In the operation of the present exemplary embodiment, the start signal ST used may be ST1 or ST2, as shown in FIG. 8.

The foregoing description is relevant to the configuration and the operation of the shift register made up of NMOS transistors. However, the present exemplary embodiment is applied to the configuration of the shift register made up of PMOS transistors.

Figure 11:
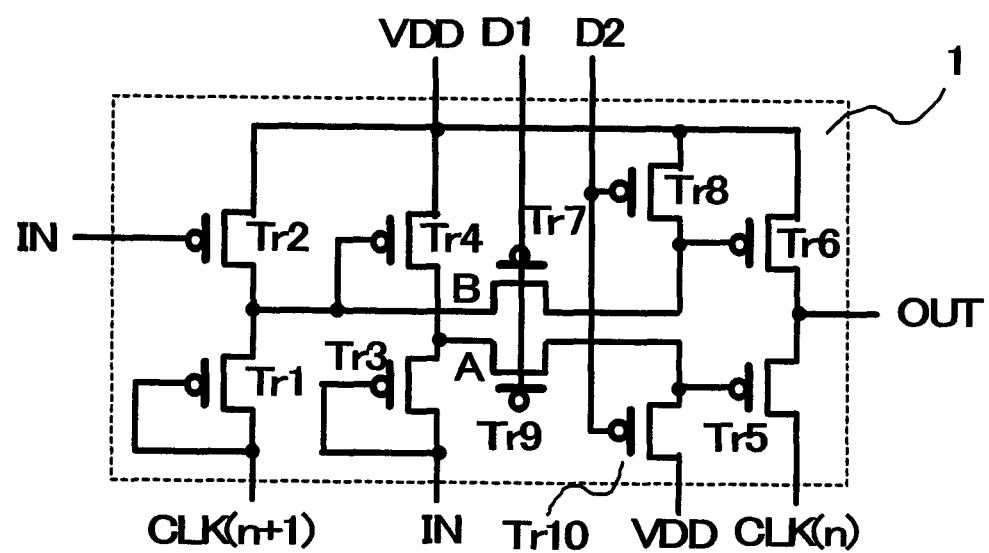
FIG. 11 is a diagram showing another circuit configuration of a register part of a shift register according to the first exemplary embodiment of the present invention.
Figure 13:
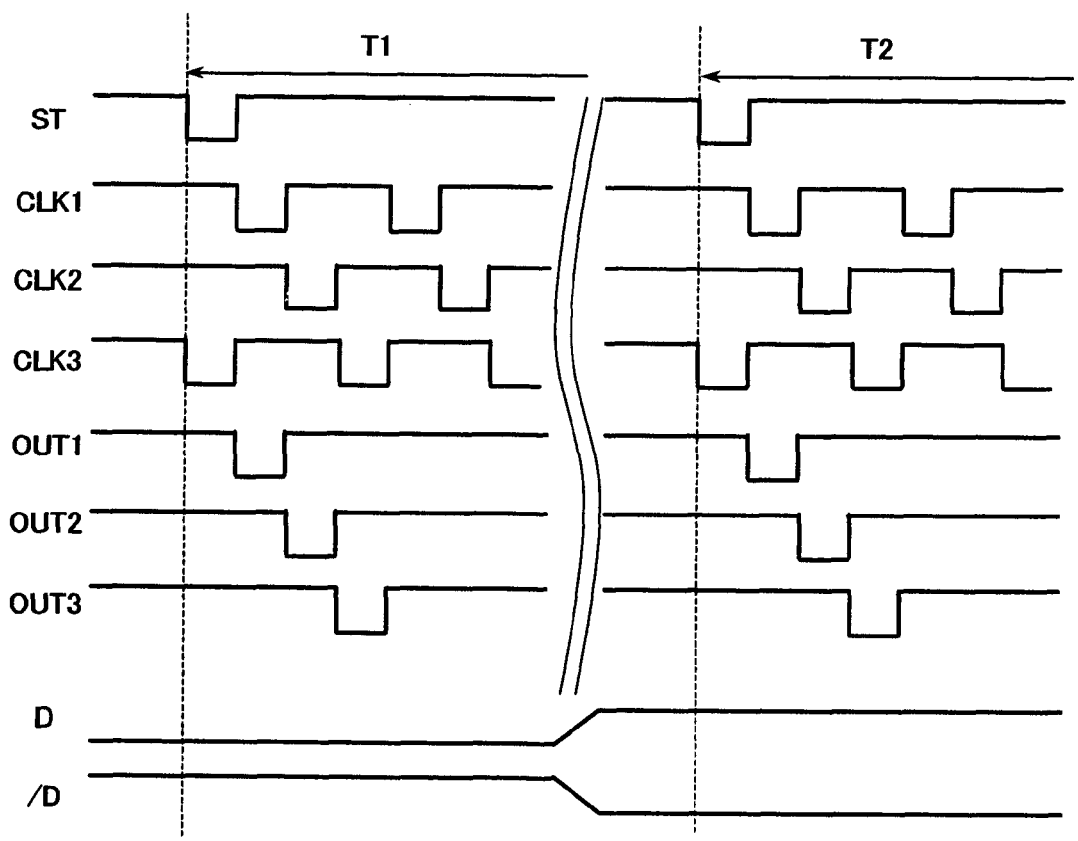
FIG. 13 is another timing chart for illustrating the operation of the scanning circuits according to third and fifth exemplary embodiments of the present invention.

FIG. 11 shows the configuration of the shift register 1 made up of the PMOS transistors. FIG. 13 depicts a timing chart illustrating its operation.

Referring to FIG. 11, the shift register 1 is made up of transistors PMOS transistors Tr1 to Tr10. Of these, the PMOS transistor Tr1 has a drain and a gate connected to a terminal CLK(n+1), and the PMOS transistor Tr2 has a drain connected to a source of the transistor Tr1, while having a gate connected to a terminal IN and having a source connected to VDD. The PMOS transistor Tr3 has a drain and a gate connected to the terminal IN, and the PMOS transistor Tr4 has a drain connected to a source of the transistor Tr3, while having a gate connected to a connection node between the source of the transistor Tr1 and the drain of the transistor Tr2, and having a source connected to VDD. The PMOS transistor Tr5 has a drain connected to the terminal CLK(n), while having a source connected to the terminal OUT, and the PMOS transistor Tr6 has a drain connected to the terminal OUT, while having a source connected to VSS. The PMOS transistor Tr9 is connected between the source of the transistor Tr3 and the gate of the transistor Tr5, and has a gate connected to the terminal D1. The PMOS transistor Tr7 is connected between a connection node between the source of the transistor Tr1 and the drain of the transistor Tr2 and the gate of the transistor Tr6, and has a gate connected to the terminal D1. The PMOS transistor Tr8 is connected between VDD and the gate of the transistor Tr6, and has a gate connected to the terminal D2. The PMOS transistor Tr10 has a drain connected to the gate of the transistor Tr5, while having a source connected to VDD and having a gate connected to the terminal D2.

The transistors Tr1 to Tr8 are the same as the corresponding transistors of the second exemplary embodiment shown in FIG. 6 insofar as the circuit configuration is concerned. The transistor Tr9 receives the signal D1 to disconnect the transistor Tr5 from the source/drain of the transistors Tr3 and Tr4. The transistor Tr10 receives the signal D2 to short the gate of the transistor Tr5 and VDD. The shift register 1 of the third exemplary embodiment has a configuration corresponding to the configuration of the second exemplary embodiment added by the transistors Tr9 and Tr10. However, since the interconnections used are VSS, D1 and D2, also present in the first exemplary embodiment, the terminal structure is in no way different from that of the second exemplary embodiment. Referring to FIG. 13, the operation of the shift register 1 of the PMOS configuration is similar to that of the shift register of the NMOS configuration, as shown in FIG. 13. That is, the outputting operation by the second scanning circuit 6 is disabled as long as the first scanning circuit 5 is performing its outputting operation. The outputting operation by the first scanning circuit 5 is disabled as long as the second scanning circuit 6 is performing its outputting operation. In the shift register 1 of FIG. 11, performing an outputting operation, the transistors Tr7 and Tr9 are in an on-state, while the transistors Tr8 and Tr10 are in an off-state. On the other hand, in the shift register 1 in the output disabled state, the transistors tr7 and Tr9 are in an off-state, while the transistors Tr8 and Tr10 are in an on-state. This sets both the transistors Tr5 and Tr6 off, so that, even if the start signal ST is supplied to the unit register 1 of the outputting disabled shift register, no signal is output to the terminal OUT.

As an alternative configuration of the present exemplary embodiment, the shift register 1, shown in FIG. 10, may be used only for the first stage, supplied with the start signal ST. In this case, the shift registers 1 of the second and the following stages may be configured as shown in FIG. 4.

Also, in case the shift register is made up of PMOS transistors, the shift register 1, shown in FIG. 11, may be used as the first-stage unit register, and the shift registers 1 of the second and the following stages may be configured as shown in FIG. 6.

The third exemplary embodiment of the present invention, described above, differs from the above-described first exemplary embodiment as to the configuration of the shift register 1 and as to using the common pulse as the start signal both for the first and second scanning circuits 5 and 6.

Fourth Exemplary Embodiment

The fourth exemplary embodiment of the present invention will now be described. As in the above-described first exemplary embodiment, the configuration of the display of the fourth exemplary embodiment of the present invention is similar to that shown in FIGS. 1 and 2.

The present exemplary embodiment differs from the other exemplary embodiments as to the configuration of the scanning circuit and the shift registers forming the scanning circuit. These points of difference will now be described with reference to FIG. 14B and FIGS. 15A and 15B.

FIGS. 15A and 15B show the configuration of the scanning circuit of the present exemplary embodiment. FIG. 14B depicts a circuit configuration of a shift register of the present exemplary embodiment which is made up of NMOS transistors. Referring to FIGS. 15A and 15B, each of the first and second scanning circuit 5 and 6 is made up of a plural number of shift registers and a set of terminals (CLK1, CLK2, CLK3, ST1 (or ST2) and D (or /D).

As regards the state of connection of the terminal CLK(n) and the terminal CLK(n+1) of the each shift register 1 of the first scanning circuit, the terminals CLK(n) and CLK(n+1) of the first-stage shift register 1_1 are connected to CLK1 and CLK2, respectively, as shown in FIG. 15A. The terminals CLK(n) and CLK(n+1) of the second-stage shift register 1_2 are connected to CLK2 and CLK3, respectively. The terminals CLK(n) and CLK(n+1) of the third-stage shift register 1-3 are connected to CLK3 and CLK1, respectively. The terminals CLK(n) and CLK(n+1) of the shift registers of the fourth and the following stages are connected in the similar manner.

The terminals CLK(n) and CLK(n+1) of the kth-stage (where k is a multiple of 3) shift register 1_k of the second scanning circuit 6 are connected to CLK1 and CLK2, respectively, as shown in FIG. 15B. The terminals CLK(n) and CLK(n+1) of the (k–1)th-stage shift register 1_k–1 of the second scanning circuit 6 are connected to CLK2 and CLK3, respectively. The terminals CLK(n) and CLK(n+1) of the (k–2)th-stage shift register 1_k–2 of the second scanning circuit 6 are connected to CLK3 and CLK1, respectively.

ST1 and ST2, which are control signals for starting the transfer operation, are supplied to the terminals IN of the first stage unit registers. Specifically, the signal ST1 is supplied to the first scanning circuit 5, while the signal ST2 is supplied to the second scanning circuit 6. The IN terminals of the shift registers of the second and the following stage are supplied with signals from the output terminals OUT of the previous stage shift register.

Referring to FIG. 14B, the shift register 1 of the present exemplary embodiment includes NMOS transistors Tr1 to Tr6 and Tr11. Of these, the NMOS transistor Tr1 has a gate and a drain connected to the terminal CLK(n+1), and the NMOS transistor Tr2 has a drain connected to a source of the transistor Tr1, while having a gate connected to IN and having a source connected to VSS. The NMOS transistor Tr3 has a gate and a drain connected to IN, and the NMOS transistor Tr4 has a drain connected to a source of the transistor Tr3, while having a gate connected to a connection node between the source of the transistor Tr1 and the drain of the transistor Tr2, and having a source connected to VSS. The NMOS transistor Tr5 has a drain connected to a terminal CLK(n), while having a gate connected to a connection node between the source of the transistor Tr3 and the drain of the transistor Tr4 and having a source connected to the terminal OUT. The NMOS transistor Tr6 has a drain connected to the terminal OUT, while having a gate connected to a connection node between the source of the transistor Tr1 and the drain of the transistor Tr2. The NMOS transistor Tr11 has a drain connected to a source of the transistor Tr6, while having a gate connected to the terminal D and having a source connected to VSS. The transistors Tr1 to Tr6 are similar to the above-described first exemplary embodiment insofar as the circuit structure is concerned.

The shift register includes terminals IN, CLK(n), CLK(n+1), OUT, VSS and D.

The transistor Tr11 is responsive to the signal D to exercise on/off control.

The signals D and /D are complementary signals that assume mutually inverted values of HIGH and LOW levels. These signals are coupled to one or the other of the first and second scanning circuits 5 and 6. For example, if D is connected to the first scanning circuit 5, /D is connected to the second scanning circuit 6. The signal D or /D is coupled to the terminal D of the shift register 1.

Figure 17:
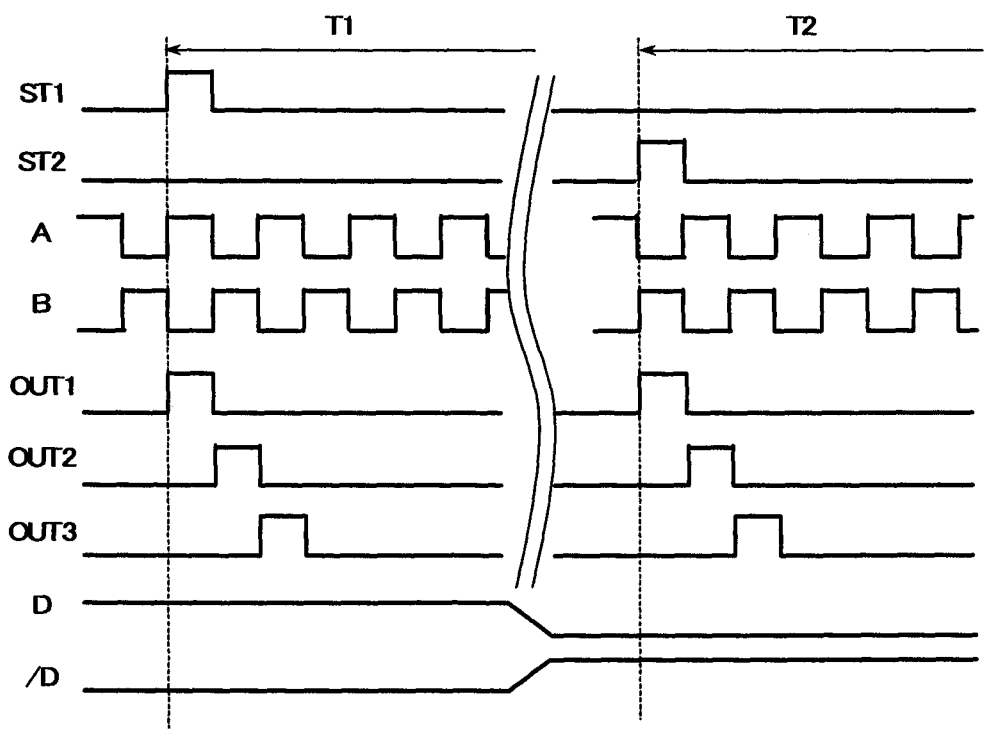
FIG. 17 is a timing chart for illustrating the operation of the scanning circuits according to the fourth exemplary embodiment of the present invention.

The operation of the fourth exemplary embodiment of the present invention will now be described with reference to FIG. 17, depicting a timing chart illustrating the operation of the scanning circuit of the present exemplary embodiment. In the present exemplary embodiment, as in the above-described first exemplary embodiment, the outputting from the second scanning circuit 6 is disabled as long as the first scanning circuit 5 is performing its driving operation. Or, the outputting from the first scanning circuit 5 is disabled as long as the second scanning circuit 6 is performing its driving operation.

First, in the shift register 1 of the scanning circuit 2, performing an outputting operation, D is kept to a HIGH level, within time period T1, as shown in FIG. 17. The transistor Tr11 is thus kept in its on-state. In this state, the operation of the transistors Tr1 to Tr6 is basically the same as the operation of the transistors Tr1 to Tr6 of the first exemplary embodiment. That is, the shift register performs the operation of transmitting a HIGH level to the next stage, at the same time as it delivers the HIGH level at the terminal OUT.

The transistor Tr11 of the output disabled shift register 1 of the scanning circuit 2 is kept to an OFF state, because /D is kept at the LOW level.

Since an electrical path VDD-OUT is thus electrically disconnected, it is possible to keep the output disabled state.

The foregoing description is relevant to the configuration and the operation of the shift register 1 formed by NMOS transistors. However, the present exemplary embodiment is applicable to a case where the unit register is formed by PMOS transistors.

Figure 16A:
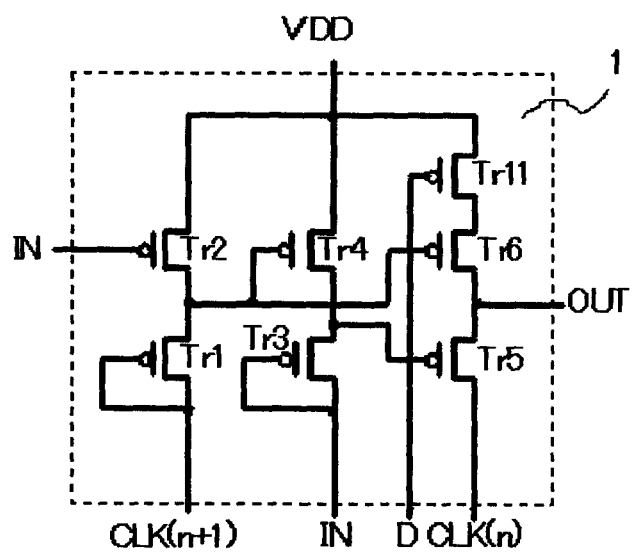
FIGS. 16A and 16B are circuit diagrams showing the circuit configuration of unit registers of shift registers according to fourth or fifth exemplary embodiment of the present invention.
Figure 16B:
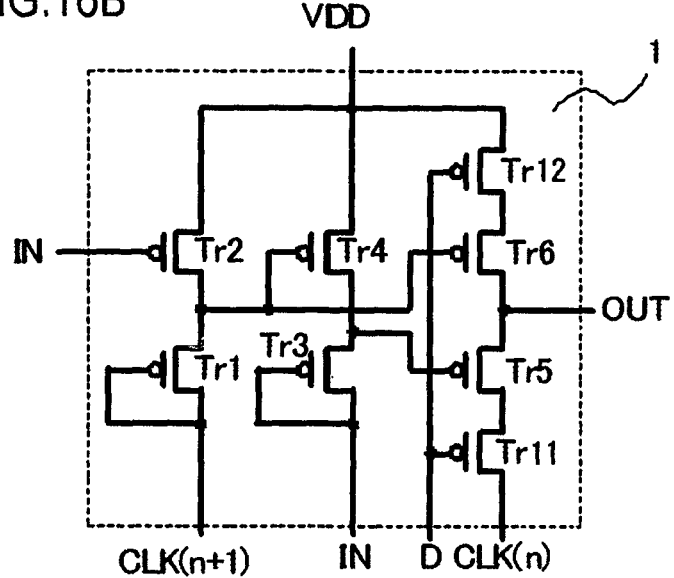
Figure 18:
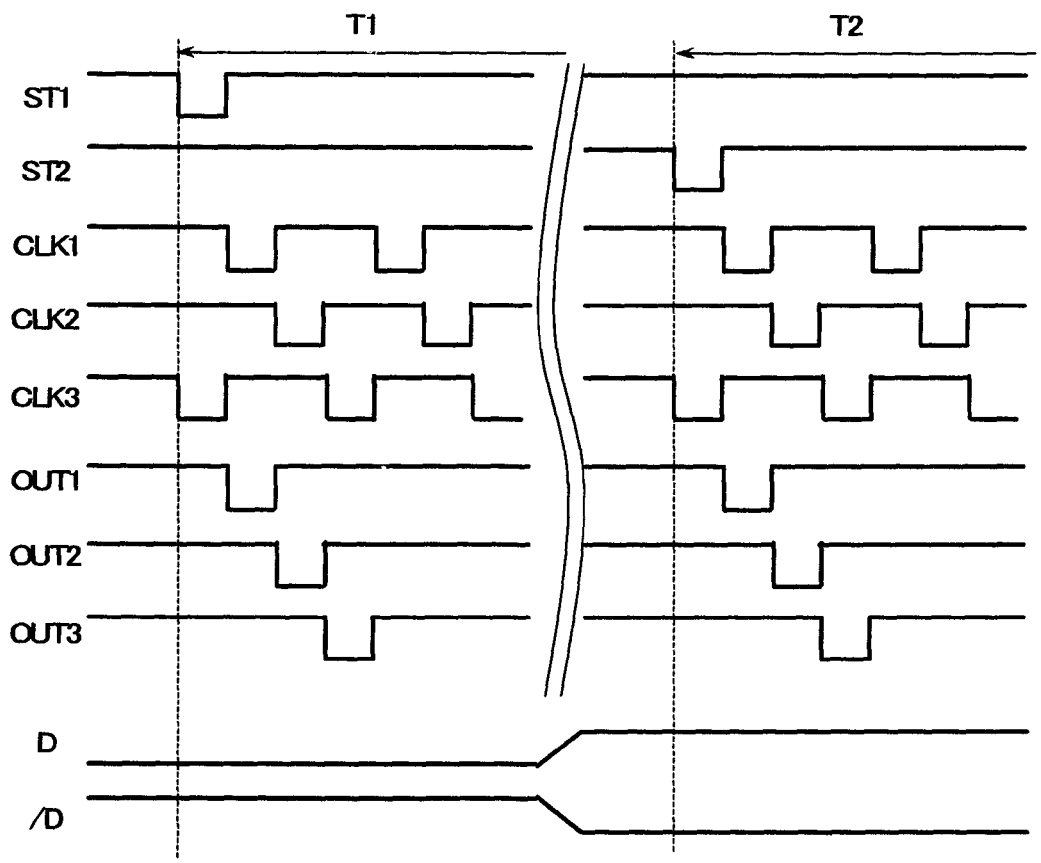
FIG. 18 is another timing chart for illustrating the operation of the scanning circuits according to the fifth exemplary embodiment of the present invention.

FIG. 16B shows the configuration of the shift register 1 in which the transistors of FIG. 14B are formed by PMOS transistors. FIG. 18 depicts a timing chart showing its operation.

Referring to FIG. 16B, the shift register of the present exemplary embodiment includes PMOS transistors Tr1 to Tr6 and Tr11. Of these, the PMOS transistor Tr1 has a gate and a drain connected to a terminal CLK(n+1), and the PMOS transistor Tr2 has a drain connected to a source of the transistor Tr1, while having a gate connected to a terminal IN and having a source connected to VDD. The PMOS transistor Tr3 has a gate and a drain connected to IN, and the PMOS transistor Tr4 has a drain connected to a source of the transistor Tr3, while having a gate connected to a connection node between the source of the transistor Tr1 and the drain of the transistor Tr2 and having a source connected to VDD. The PMOS transistor Tr5 has a drain connected to the terminal CLK(n), while having a gate connected to a connection node between the source of the transistor Tr3 and the drain of the transistor Tr4 and having a source connected to a terminal OUT. The PMOS transistor Tr6 has a drain connected to the terminal OUT, while having a gate connected to a connection node between the source of the transistor Tr1 and the drain of the transistor Tr2. The PMOS transistor Tr11 has a drain connected to the source of the transistor Tr6, while having a gate connected to the terminal D and having a source connected to VDD. The transistors Tr1 to Tr6 are in no way different in circuit configuration from the corresponding transistors of the first exemplary embodiment.

The shift register 1, formed by PMOS transistors, similarly include terminals IN, CLK(n), CLK(n+1), OUT, VSS and D. The transistor Tr11 receives the signal D to exercise on/off control.

The signal /D is a complementary signal of the signal D, and is coupled to one or the other of the first and second scanning circuits 5 and 6. For example, if D is coupled to the first scanning circuit 5, /D is coupled to the second scanning circuit 6. D or /D is coupled to the terminal D in each shift register 1.

Referring to FIG. 18, the operation of the shift register of the PMOS configuration is similar to that of the shift register of the NMOS configuration. That is, the outputting from the second scanning circuit 6 is disabled as long as the first scanning circuit 5 is performing its driving operation. Or, the outputting from the first scanning circuit 5 is disabled as long as the second scanning circuit 6 is performing its driving operation. As regards the operation of the scanning circuit performing the outputting operation and that of the output-disabled scanning circuit, there is basically no difference from the case of the NMOS configuration. However, it is possible for the shift register of the scanning circuit with the operation stopped to keep its output-disabled state, because the transistor Tr11 is turned off and hence the path between VDD and OUT is electrically disconnected.

Fifth Exemplary Embodiment

A fifth exemplary embodiment of the present invention will now be described. The configuration of the display of the fifth exemplary embodiment of the present invention is the same as the configuration of the above-described first exemplary embodiment shown in FIGS. 1 and 2. The scanning circuit is the same as the configuration shown in FIGS. 15A and 15B, as in the fourth exemplary embodiment. However, in the present exemplary embodiment, the signal ST is preferably used as the start signal (ST1, ST2).

In the present exemplary embodiment, the configuration of the shift register, forming the scanning circuit, differs from that in the other exemplary embodiments. Hence, the configuration of the unit register will now be described with reference to FIG. 14A, showing the circuit configuration of the shift register formed by NMOS transistors of the present exemplary embodiment.

Figure 14A:
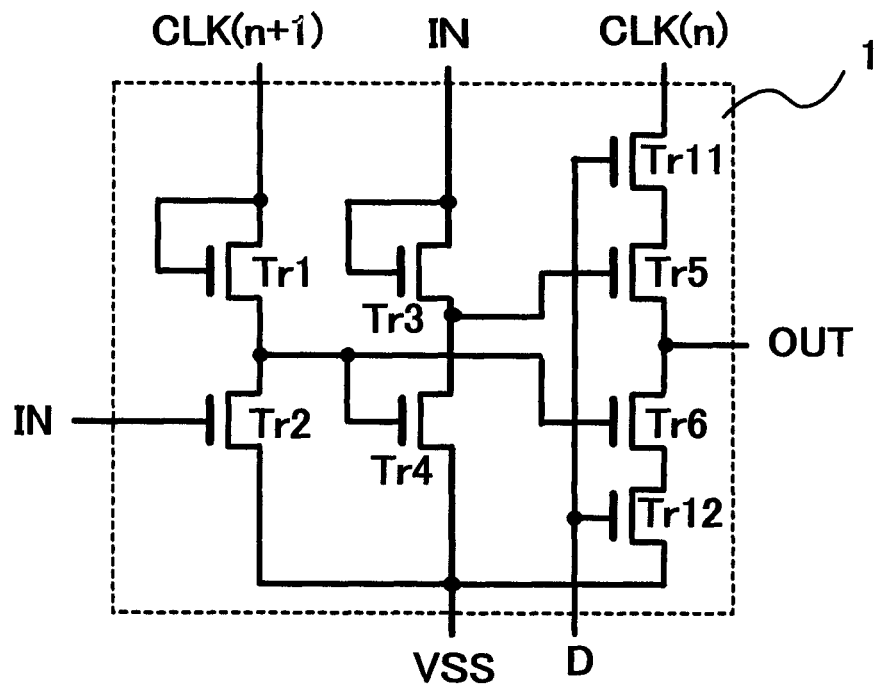
FIGS. 14A and 14B are circuit diagrams showing circuit configurations of unit registers of shift registers according to fourth and fifth exemplary embodiments of the present invention.
Figure 14B:
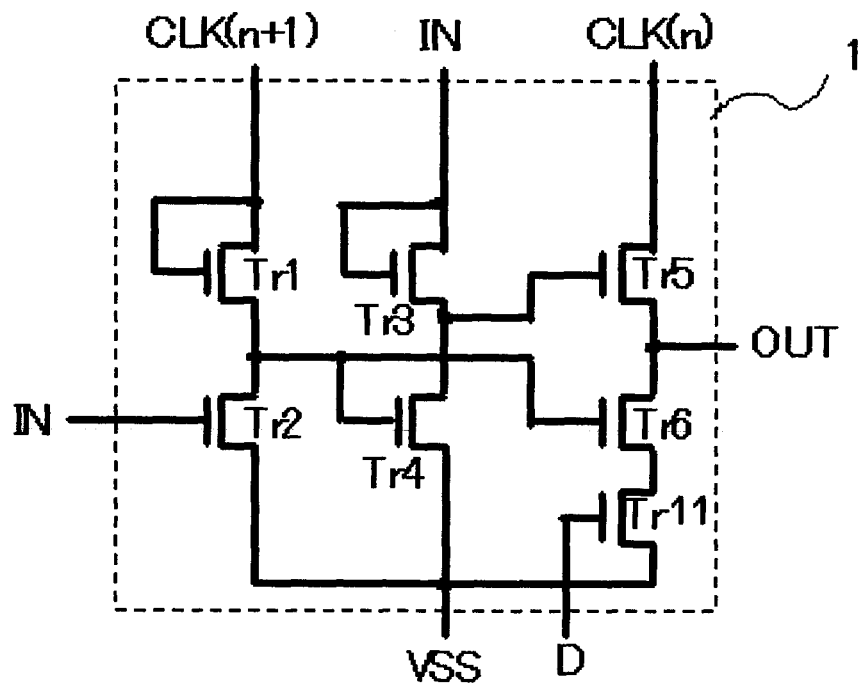

Referring to FIG. 14A, the shift register of the present exemplary embodiment includes NMOS transistors Tr1 to Tr6, Tr11 and Tr12. Of these, the NMOS transistor Tr1 has a gate and a drain connected to a terminal CLK(n+1), and the NMOS transistor Tr2 has a drain connected to a source of the transistor Tr1, while having a gate connected to IN and having a source connected to VSS. The NMOS transistor Tr3 has a gate and a drain connected to IN, and the NMOS transistor Tr4 has a drain connected to a source of the transistor Tr3, while having a gate connected to a connection node between the source of the transistor Tr1 and the drain of the transistor Tr2 and having a source connected to VSS. The NMOS transistor Tr11 has a drain connected to a second scanning circuit 6, while having a gate connected to the terminal D. The NMOS transistor Tr5 has a drain connected to a source of the transistor Tr11, while having a gate connected to a connection node between the source of the transistor Tr3 and the drain of the transistor Tr4 and having a source connected to the terminal OUT. The NMOS transistor Tr6 has a drain connected to a terminal OUT, while having a gate connected to a connection node between the source of the transistor Tr1 and a drain of the transistor Tr2. The NMOS transistor Tr12 has a drain connected to a source of the transistor Tr6, while having a gate connected to the terminal D and having a source connected to VSS. The transistors Tr1 to Tr6 are the same as the corresponding transistors of the first exemplary embodiment insofar as the circuit configuration is concerned.

The shift register 1 has terminals IN, CLK(n), CLK(n+1), OUT, VSS and D.

The transistors Tr11 and Tr12 are controlled to be turned on or off responsive to the signal D. The signals D and /D are complementary signals which assume mutually inverted values of HIGH and LOW levels. These signals are coupled to one or the other of the first and second scanning circuits 5 and 6. For example, if the signal D is connected to the first scanning circuit 5, /D is connected to the second scanning circuit 6. The signal D or /D is connected to the terminal D of the shift register 1.

The operation of the fifth exemplary embodiment of the present invention will now be described with reference to FIG. 12. As in the first exemplary embodiment, the outputting from the second scanning circuit 6 is disabled as long as the first scanning circuit 5 is performing its driving operation. Or, the outputting from the first scanning circuit 5 is disabled as long as the second scanning circuit 6 is performing its driving operation.

First, in the shift register 1 of the scanning circuit 2, performing an outputting operation, the transistors Tr11 and Tr12 (see FIG. 14A) are both kept to an on-state, because the signal D is kept HIGH during the period T1, as shown in FIG. 12. In this state, the operation of the transistors Tr1 to Tr6 is basically the same as the operation of the transistors Tr1 to Tr6 of the first exemplary embodiment. That is, the unit register outputs the HIGH level at the terminal OUT, at the same time as it transfers the HIGH level to the next stage.

On the other hand, in the shift register 1 of the output-disabled scanning circuit 2, the signal /D is kept LOW, and hence the transistors Tr11 and Tr12 (see FIG. 14A) are both kept off.

Thus, the paths between CLK(n) and OUT and between VSS and OUT are electrically disconnected, and hence the output-disabled state can be kept.

The foregoing description is relevant to the configuration and the operation of the shift register 1 made up of NMOS transistors. However, the present exemplary embodiment is applicable to the shift register made up of PMOS transistors.

FIG. 16A is a circuit diagram showing the configuration of a shift register made up of PMOS transistors. FIG. 13 depicts a timing chart for illustrating the operation of the shift register 1 of FIG. 16A.

Referring to FIG. 16A, the shift register 1 of the present exemplary embodiment includes PMOS transistors Tr1 to Tr6, Tr11 and Tr12. Of these, the PMOS transistor Tr1 has a gate and a drain connected to a terminal CLK(n+1), and the PMOS transistor Tr2 has a drain connected to a source of the transistor Tr1, while having a gate connected to IN and having a source connected to VDD. The PMOS transistor Tr3 has a gate and a drain connected to IN, and the PMOS transistor Tr4 has a drain connected to a source of the transistor Tr3, while having a gate connected to a connection node between the source of the transistor Tr1 and the drain of the transistor Tr2 and having a source connected to VDD. The PMOS transistor Tr11 has a drain connected to a terminal CLK(n), while having a gate connected to the terminal D. The PMOS transistor Tr5 has a drain connected to a source of the transistor Tr11, while having a gate connected to a connection node between a source of the transistor Tr3 and the drain of the transistor Tr4 and having a source connected to the terminal OUT. The NMOS transistor Tr6 has a drain connected to the terminal OUT, while having a gate connected to a connection node between the source of the transistor Tr1 and a drain of the transistor Tr2. The PMOS transistor Tr12 has a drain connected to a source of the transistor Tr6, while having a gate connected to the terminal D and having a source connected to VDD. The transistors Tr1 to Tr6 are the same as the corresponding transistors of the first exemplary embodiment insofar as the circuit configuration is concerned. The shift register 1, made up of PMOS transistors, also has terminals IN, CLK (n), CLK(n+1), OUT, VSS and D. The transistors Tr11 and Tr12 are responsive to the signal D to exercise on/off control. The signals D and /D are complementary signals that assume mutually inverted values of HIGH and LOW levels. These signals are coupled to one or the other of the first and second scanning circuits 5 and 6. For example, if the signal D is connected to the first scanning circuit 5, the signal /D is connected to the second scanning circuit 6. The signal D or /D is connected to the terminal D of the shift register 1.

From FIG. 13, the operation of the shift register of the PMOS configuration is similar to that of the NMOS configuration. That is, the outputting from the second scanning circuit 6 is disabled as long as the first scanning circuit 5 is performing its driving operation, or the outputting from the first scanning circuit 5 is disabled as long as the second scanning circuit 6 is performing its driving operation.

The operation of the scanning circuit, performing its outputting operation, and that of the output-disabled scanning circuit, are basically the same as those of the scanning circuits of the NMOS configuration. However, the shift register 1 of the operation-disabled scanning circuit may be kept in its output-disabled state, because the transistor Tr11 is turned off and hence the paths between CLK(n) and OUT and between VDD and OUT are electrically disconnected.

Also, in the operation of the present exemplary embodiment, the start signal ST may be signals ST1 and ST2, as shown in FIG. 12 or 13.

As a modification of the present exemplary embodiment, the shift register 1 shown in FIG. 14A may be used for the first stage receiving the start signal ST, while the configuration shown in FIG. 14B may be used for the second and following stages of the shift register. Preferably, the signals of the terminals OUT of respective previous stages of the shift register are used as gate signals of the second and following stages of the shift register.

For the PMOS configuration shift register, the shift register shown in FIG. 16A may be used for the first stage receiving the start signal ST, while the configuration shown in FIG. 16B may be used for the second and following stages of the shift register. Preferably, the signals of the terminals OUT of the respective previous stages of the shift register are used as gate signals of the second and following stages of the shift register.

The fifth exemplary embodiment of the present invention differs from the fourth exemplary embodiment as to the configuration of the shift register and as to the first and second scanning circuits 5 and 6 being able to use a common pulse as a start signal.

Sixth Exemplary Embodiment

A sixth exemplary embodiment of the present invention will now be described. The configuration of the display of the present sixth exemplary embodiment is the same as that shown in FIG. 1. In the present exemplary embodiment, the first scanning circuit 5 and the second scanning circuit 6 are provided on either sides of the display 4, and outputs of the respective scanning circuits are interconnected via common gate bus lines 7. The configuration of FIG. 5 is preferred as the pixel that makes up the display section 4 of FIG. 1.

Figure 19:
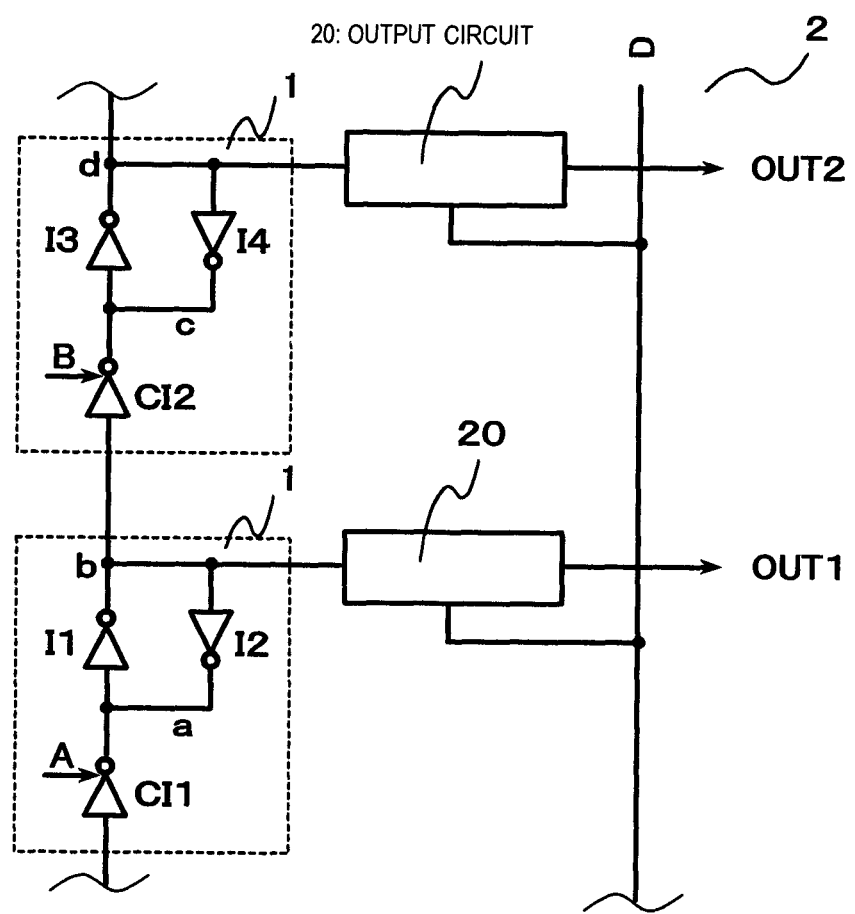
FIG. 19 is a circuit diagram showing the configuration of the scanning circuit according to a sixth exemplary embodiment of the present invention.

FIG. 19 is a schematic circuit diagram showing the configuration of a scanning circuit of the present exemplary embodiment. Referring to FIG. 19, the scanning circuit of the present exemplary embodiment is made up of a shift register 1 and an output circuit 20.

Figure 20A:
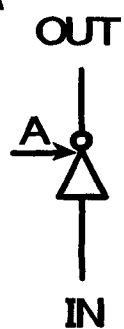
FIGS. 20A to 20D are circuit diagrams showing a symbolic circuit configuration of the scanning circuit according to the sixth exemplary embodiment of the present invention.
Figure 20B:
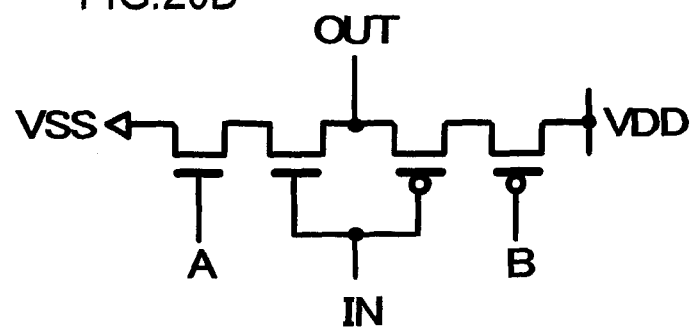
Figure 20C:
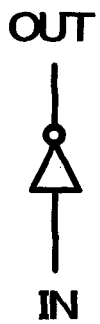
Figure 20D:
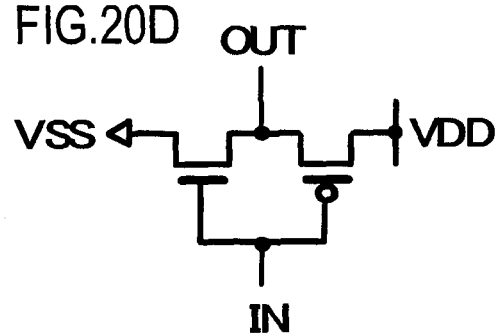

The shift register 1 includes inverter circuits (I1,I2; I3,I4) and a clocked inverter circuit (CI1; CI2). In FIG. 19, the inverter circuits and the clocked inverter circuit are indicated by corresponding symbols. FIG. 20 shows these symbols represented by NMOS and PMOS transistors. The clocked inverter of FIG. 20A corresponds to the circuit configuration shown in FIG. 20B. In FIG. 20B, a PMOS transistor that receives a signal B at its gate is connected between a CMOS inverter and a HIGH potential side power supply VDD. The CMOS inverter is made up by a PMOS transistor and an NMOS transistor having gates coupled in common to an input IN and having drains coupled in common to an output OUT. The NMOS transistor that receives a signal A at its gate is connected between the CMOS inverter and a LOW potential side power supply VSS. In FIG. 20B, the signal B is a complementary signal of the signal A. The inverter of FIG. 20C is formed by a CMOS inverter shown in FIG. 20D.

Figure 21:
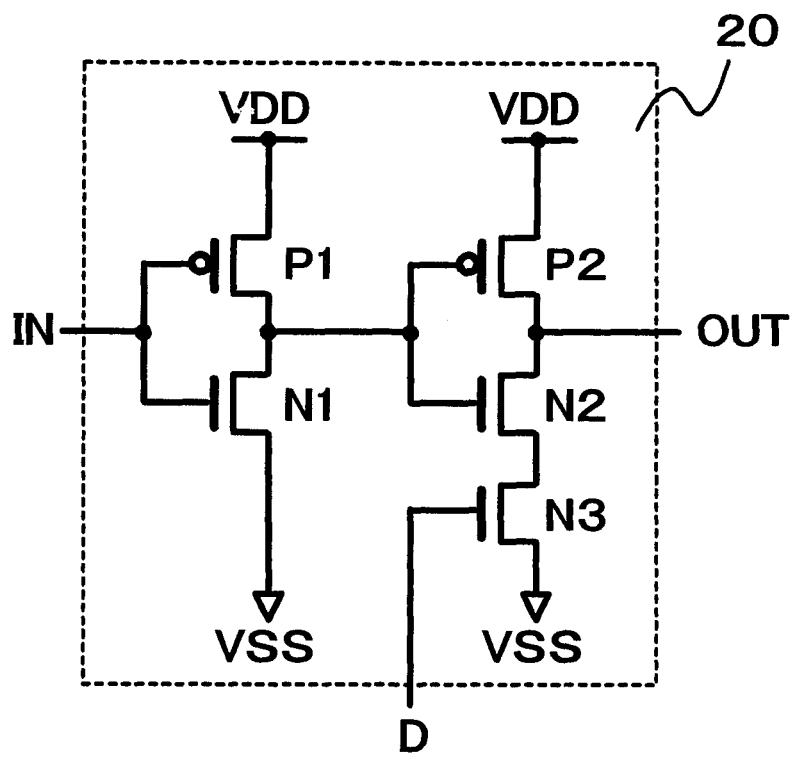
FIG. 21 is a circuit diagram showing the circuit configuration of an output circuit of the scanning circuit according to the sixth exemplary embodiment of the present invention.

FIG. 21 is a circuit diagram in which an output circuit 20 is represented by NMOS and PMOS transistors. It is seen from FIG. 21 that the output circuit 20 is basically a cascaded connection of inverters made up of transistors P1 and N1 and transistors P2 and N2. In addition, an NMOS transistor N3 is connected between the source of the transistor N2 and a VSS line. To the gate of the NMOS transistor N3 is connected a line of the control signal D. The NMOS transistor N3 is turned on/off by an output of an external device, not shown, via this control signal D.

Figure 22:
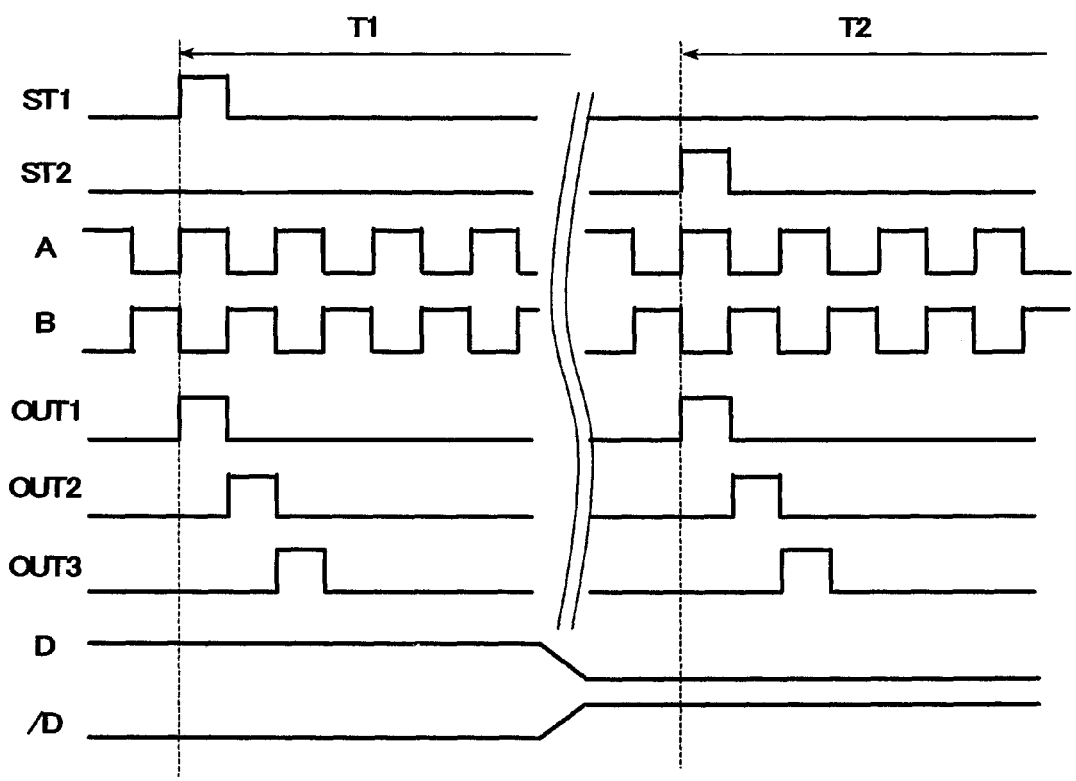
FIG. 22 is a timing chart for illustrating the operation of the sixth exemplary embodiment of the present invention.

The operation of the present exemplary embodiment, the configuration of which is shown in FIG. 19, will now be described with reference to a timing chart of FIG. 22 illustrating the operation of the present exemplary embodiment. The timing chart of FIG. 22 is in two parts, one being for a period (T1) of driving by the first scanning circuit 5 and the other being for a period (T2) of driving by the second scanning circuit 6.

If, with the clocks A and B being HIGH and LOW, respectively, a start pulse ST1 is delivered from the terminal IN, during the period T1, the node a goes LOW by the inverting operation by the clocked inverter C11. The node b thus becomes HIGH by the inverter C11. Since the state of connection of the clock A to the clocked inverter C11 is opposite to that of the clock B to the clocked inverter C12, the latter C12 is off at this timing. The nodes a and b are thus latched to LOW and HIGH, respectively. Since the node b is HIGH, and P3 is ON, with the control signal D being LOW, the output circuit 20 transfers the HIGH level to OUT1.

When next the clocks A and B go LOW and HIGH, respectively, the clocked inverters C11 and C12 are turned off and on, respectively. A node c thus goes LOW by the inverting operation of C12. A node d goes HIGH by the inverting operation of I3. The output circuit 20 thus transfers a HIGH level to OUT2. In this manner, each output circuit 20 outputs the HIGH level to OUT as it sequentially transfers the output to the next stage.

In the second scanning circuit 6, the start signal ST2 is LOW and the control signal D is LOW. Hence, the HIGH level is not supplied to OUT. Since the NMOS transistor N3 is OFF, an output is supplied to OUT. Thus, in case the potential at OUT has become LOW, in the first scanning circuit 5, the steady-state current may be prevented from flowing through the current path between VDD and VSS via transistor N2.

The reverse operation to that described above takes place during the period T2. At this time, the signal ST1 is kept LOW and the outputting operation is by the signal ST2.

Thus, with the present exemplary embodiment, making use of the circuit of the CMOS configuration, it is possible to realize the meritorious effect comparable to those of the other exemplary embodiment.

Seventh Exemplary Embodiment

Figure 7:
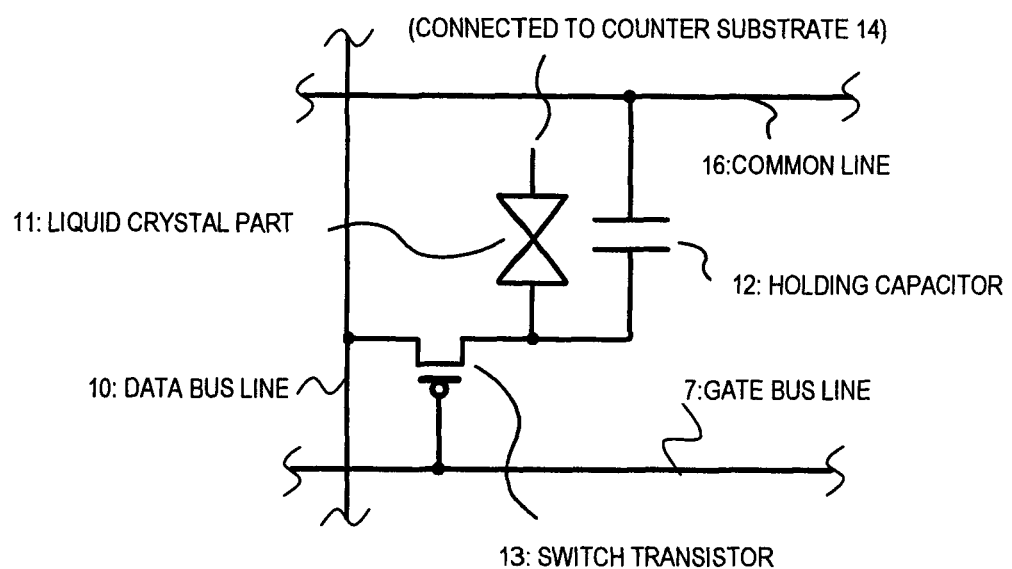
FIG. 7 is a diagram showing the circuit configuration of a pixel part of the display according to the second exemplary embodiment of the present invention.

A seventh exemplary embodiment of the present invention will now be described. Similarly to the sixth exemplary embodiment, the present seventh exemplary embodiment of the display is the same in configuration as the exemplary embodiment shown in FIG. 1. In the present exemplary embodiment, the first scanning circuit 5 and the second scanning circuit 6 are arranged on both sides of the display 4. The outputs of the respective scanning circuits are coupled by common gate bus lines 7. The pixels that make up the display section 4 of FIG. 1 may be configured as shown in FIG. 5 or 7.

Figure 24:
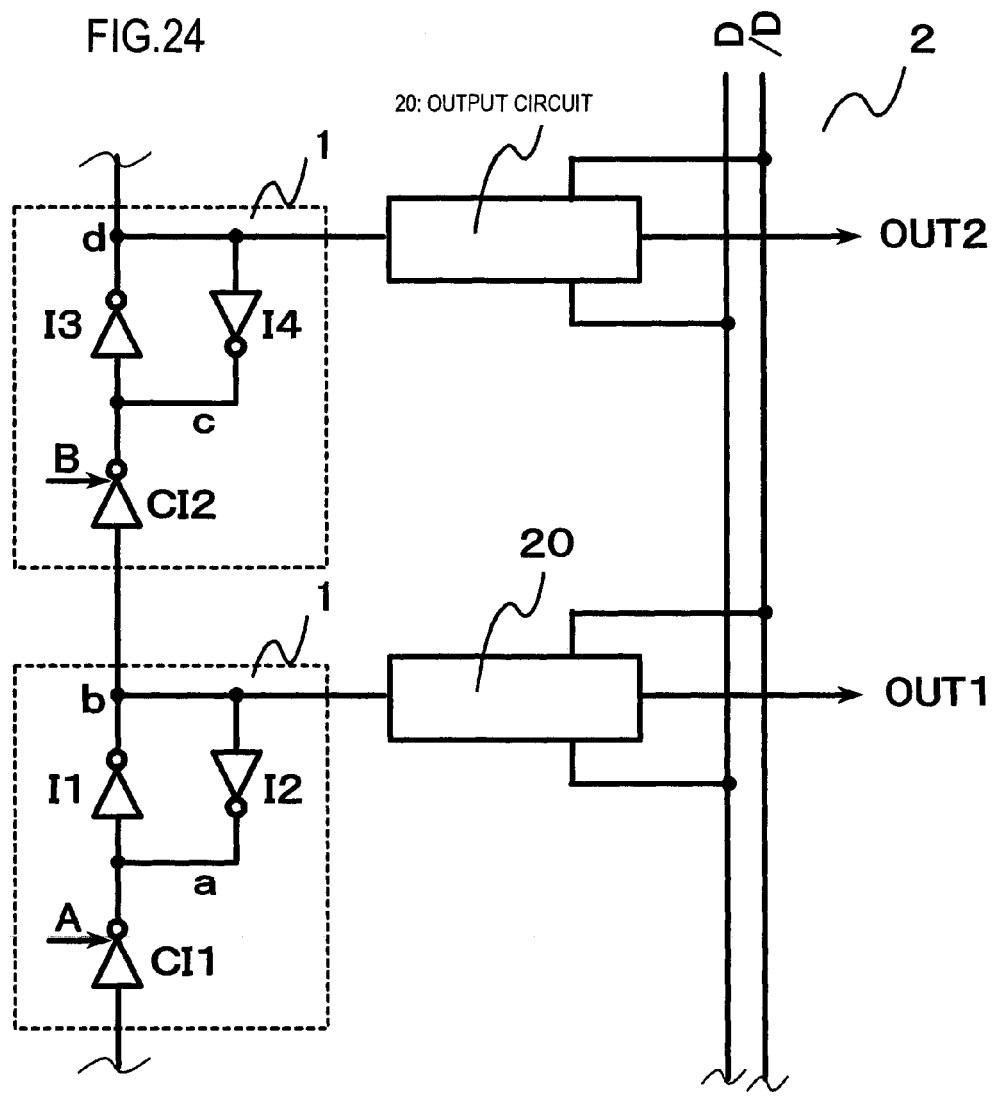
FIG. 24 is a circuit diagram showing the configuration of a scanning circuit according to the seventh exemplary embodiment of the present invention.

FIG. 24 is a diagram illustrating the configuration of the scanning circuit of the present exemplary embodiment. Referring to FIG. 24, the scanning circuit of the present exemplary embodiment includes shift registers 1 and output circuits 20. Each shift register 1 includes an inverter circuit and two clocked inverter circuits, connected as shown. As in the sixth exemplary embodiment, the inverter circuit and the clocked inverter circuits are configured in a similar manner to those shown in FIG. 20. As the start signal ST, a signal common to the first and second scanning circuits is supplied to the terminal IN of the first stage shift register 1.

Figure 25:
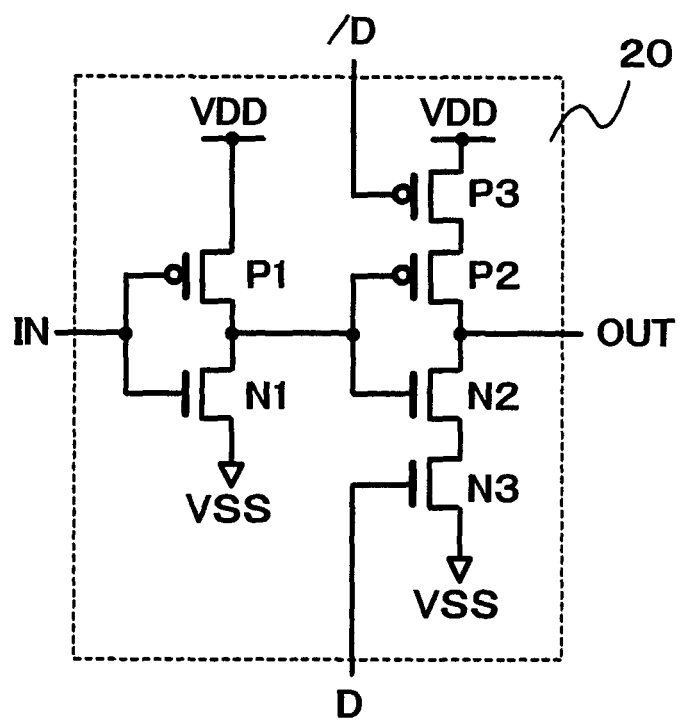
FIG. 25 is a circuit diagram showing a circuit configuration of an output circuit of the scanning circuit according to the seventh exemplary embodiment of the present invention.

The circuit configuration of the output circuit 20, again made up by NMOS and PMOS transistors, is shown in FIG. 25.

Referring to FIG. 25, the output circuit 20 is basically a cascaded connection of an inverter circuit made up of a PMOS transistor P1 and an NMOS transistor N1, and an inverter circuit made up of a PMOS transistors P2 and an NMOS transistor N2. In addition, a PMOS transistor P3 is connected between the PMOS transistor P2 and the VDD line, and an NMOS transistor N3 is connected between the NMOS transistor N2 and the VSS line. A signal line D and a signal line /D are connected to the gate of the NMOS transistor N3 and to the gate of the PMOS transistor P3, respectively. Hence, the NMOS transistor N3 and the PMOS transistor P3 are controlled on/off by the signals D and /D output from the externally connected device, not shown.

Figure 23:
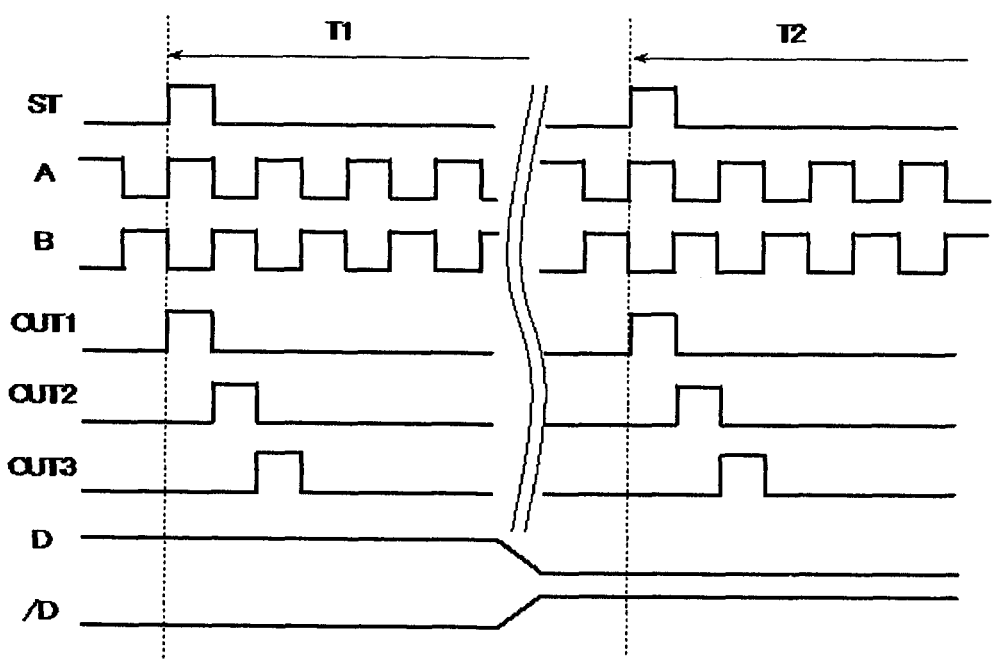
FIG. 23 is a timing chart for illustrating the operation of a seventh exemplary embodiment of the present invention.

FIG. 23 is a timing chart for illustrating the operation of a scanning circuit of the present exemplary embodiment. The scanning circuit of the present exemplary embodiment transfers an output to the next stage of the shift register, while delivering, by its output circuit 10, an output signal to the terminal OUT, under control by the start pulse ST and clocks A and B. In the scanning circuit 2, not performing an outputting operation, the transistors N3 and P3, shown in FIG. 25, are both off by the signals D and /D, and hence the output-disabled state of the scanning circuit 2 may be kept even on application of the start signal.

With the present exemplary embodiment, the circuit of the CMOS configuration may be used, as in the above-described sixth exemplary embodiment. In addition, a start signal common to both the first and second scanning circuits may be used.

Eighth Exemplary Embodiment

Figure 26:
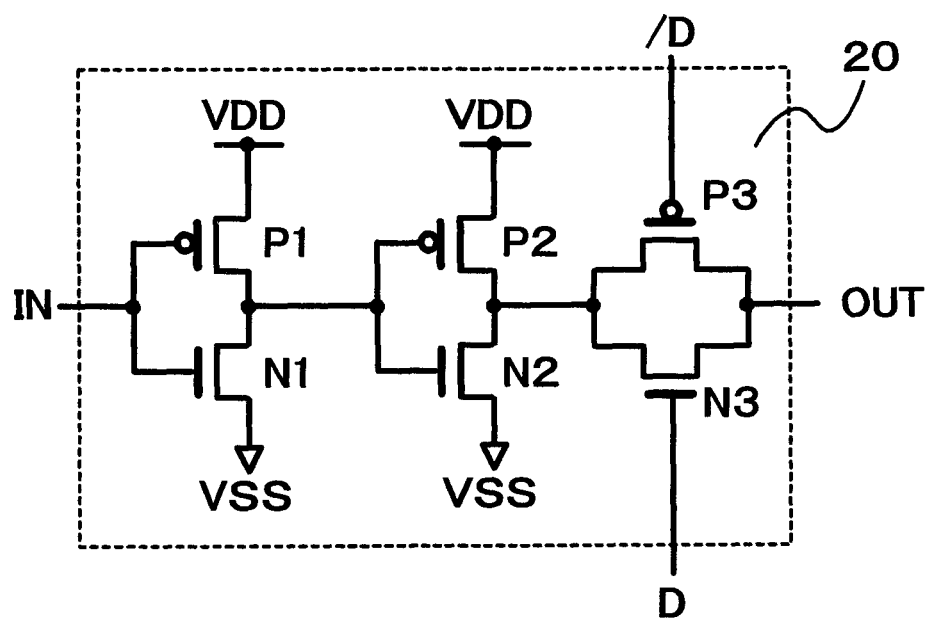
FIG. 26 is a circuit diagram showing another circuit configuration of an output circuit of a scanning circuit according to an eighth exemplary embodiment of the present invention.
Figure 27:
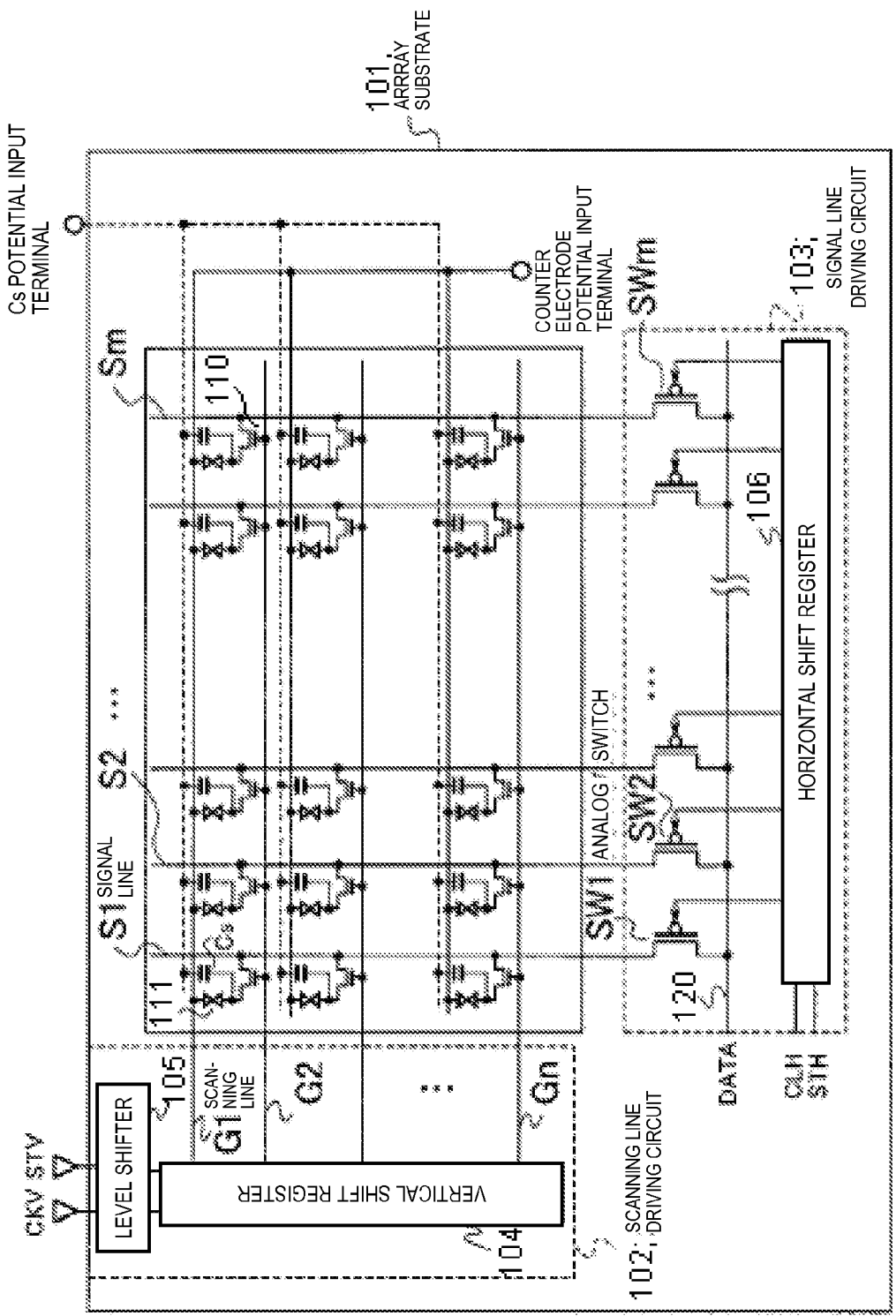
FIG. 27 is a schematic plan view showing a planar display according to Patent Publication 1.
Figure 28:
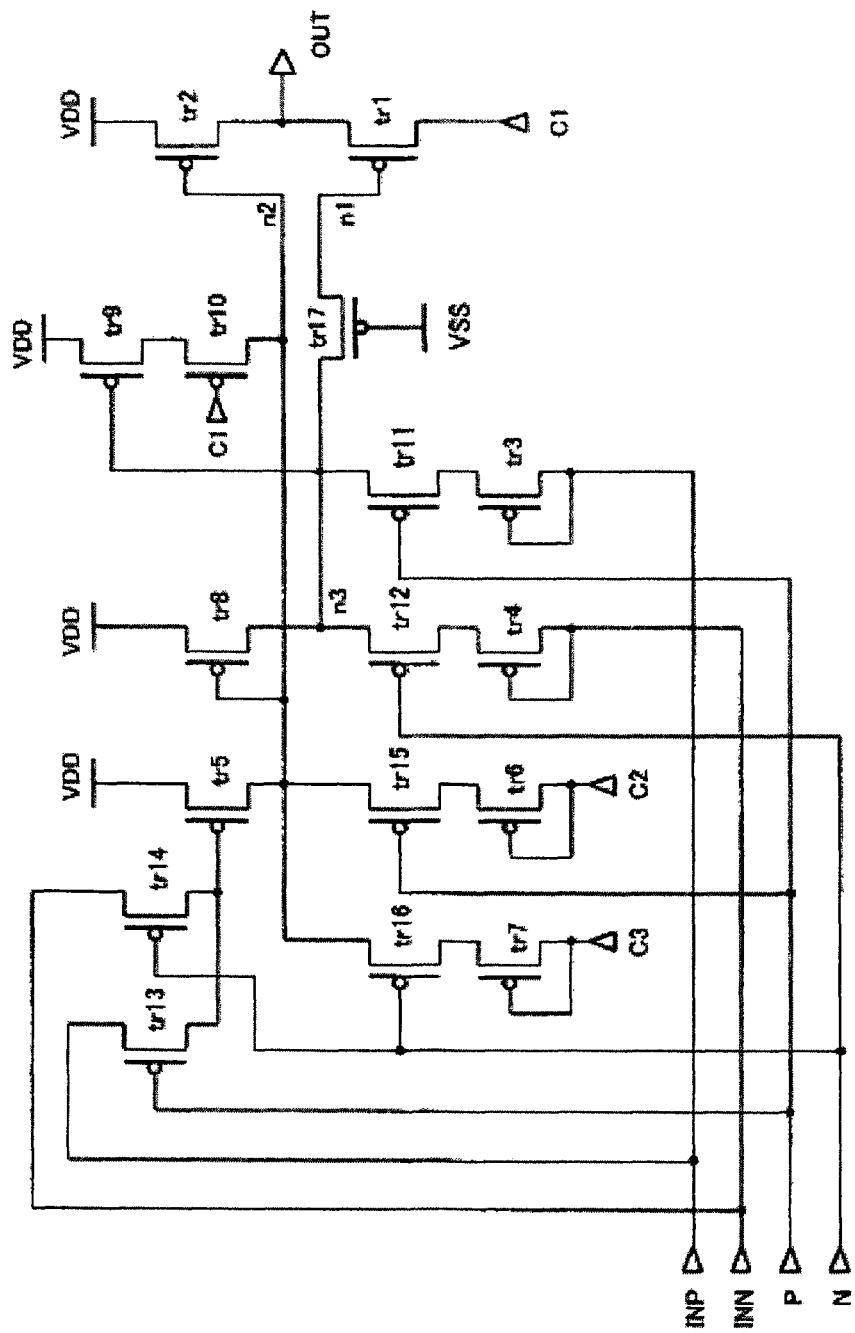
FIG. 28 is a circuit diagram showing a circuit configuration of a three-phase bidirectional shift register of Patent Publication 1.
Figure 29:
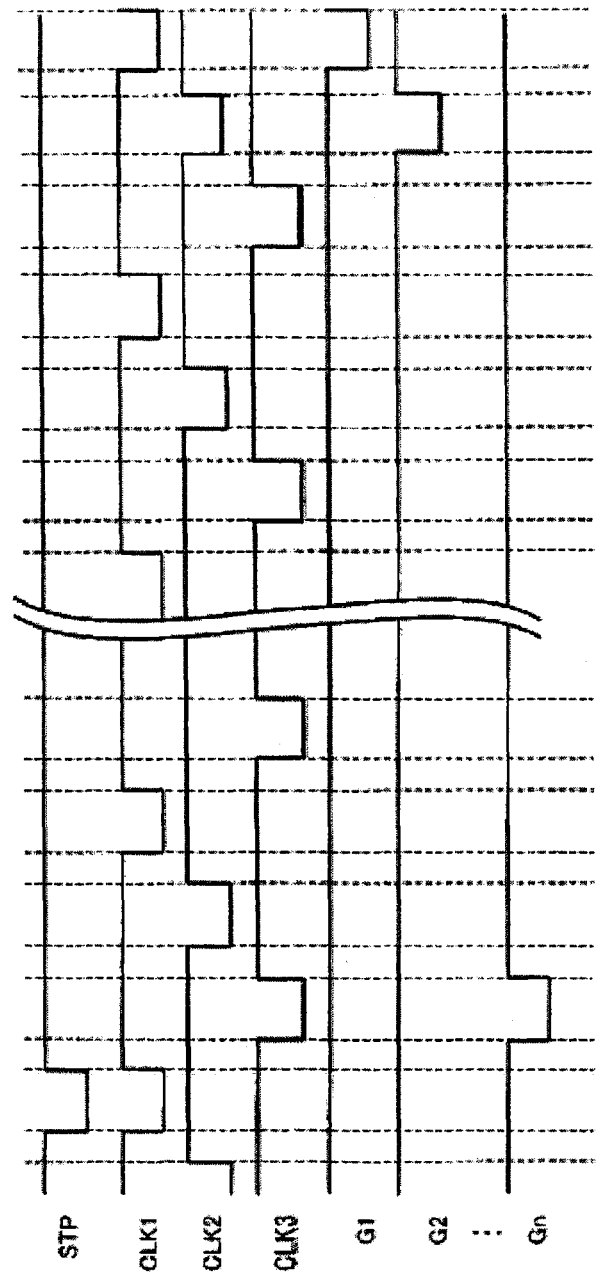
FIG. 29 is a timing chart for illustrating the pulse shifting of Patent Publication 1 in the forward direction.
Figure 30:
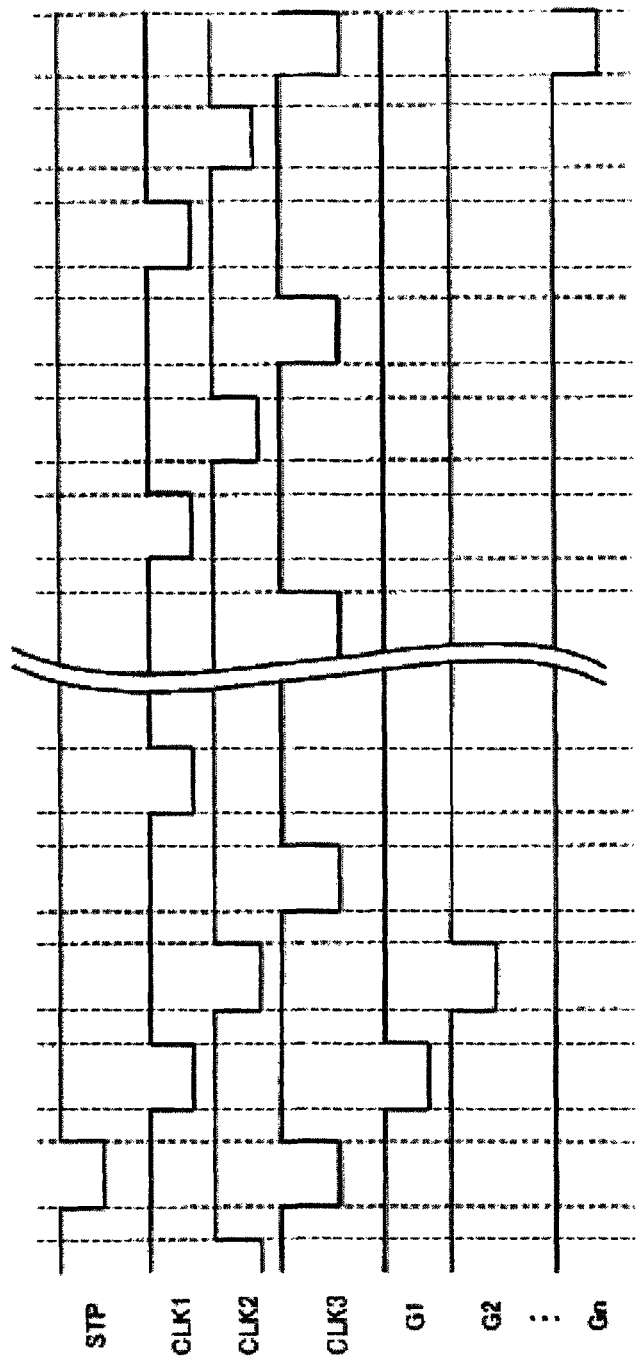
FIG. 30 is a timing chart for illustrating the pulse shifting of Patent Publication 1 in the reverse direction.
Figure 31:
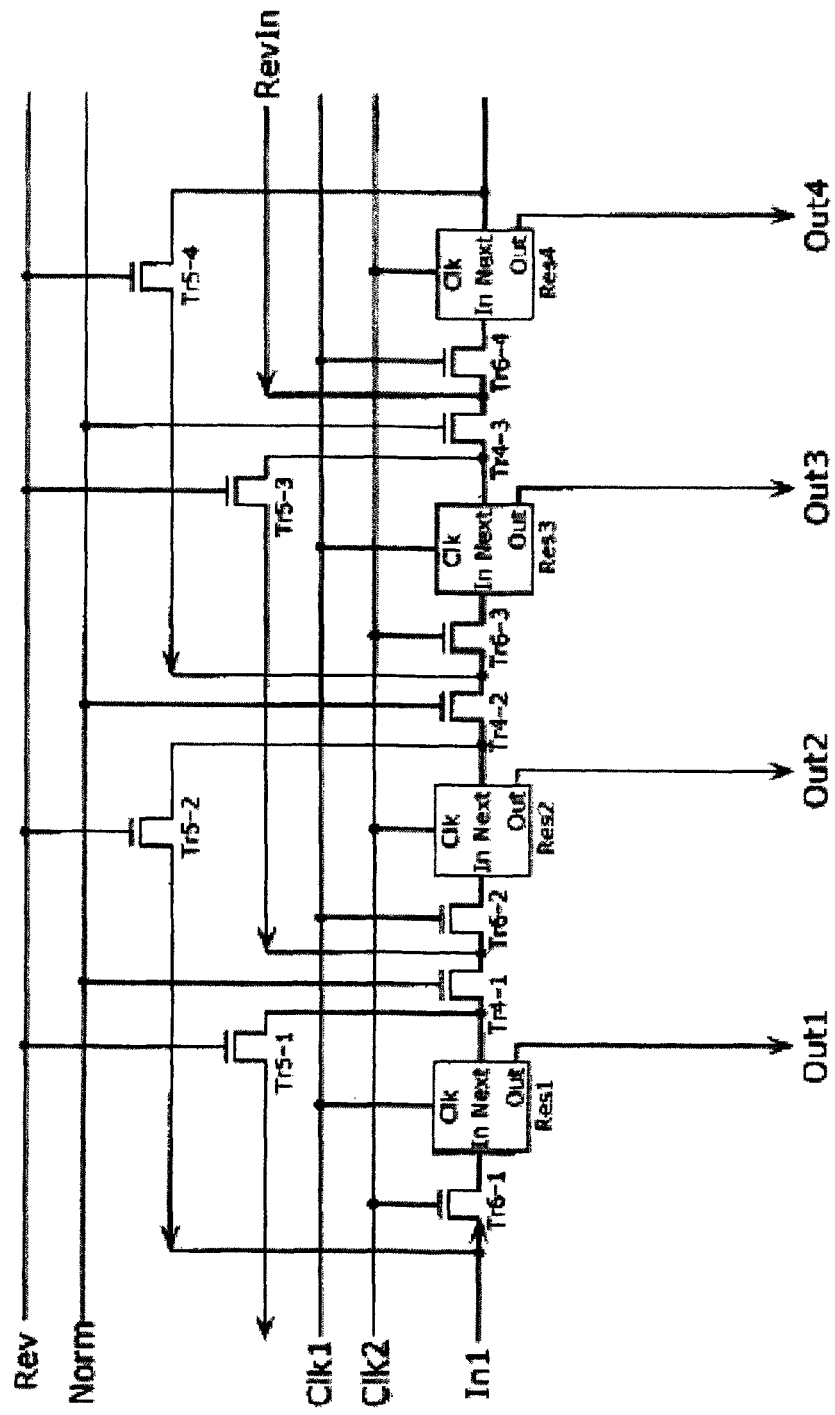
FIG. 31 is a block diagram showing the configuration of a shift register of Patent Publication 2.
Figure 32A:
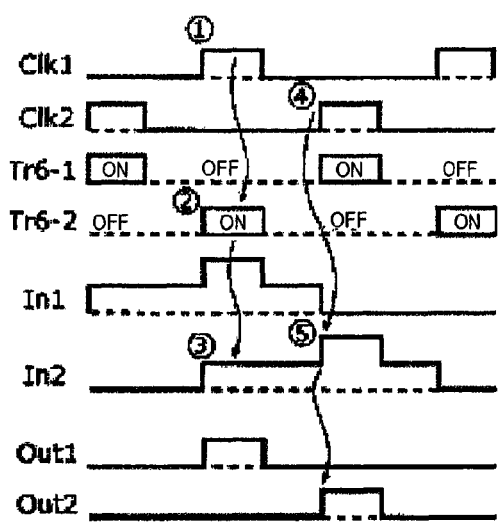
FIGS. 32A and 32B are timing charts showing the normal operation for forward shifting and the inverting operation for reverse shifting according to Patent Publication 2, respectively.
Figure 32B:
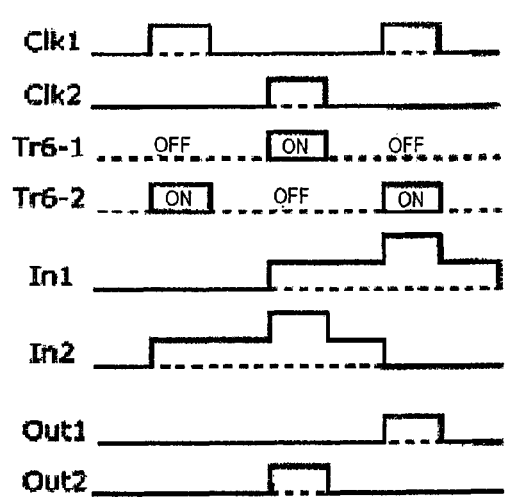
Figure 34A:
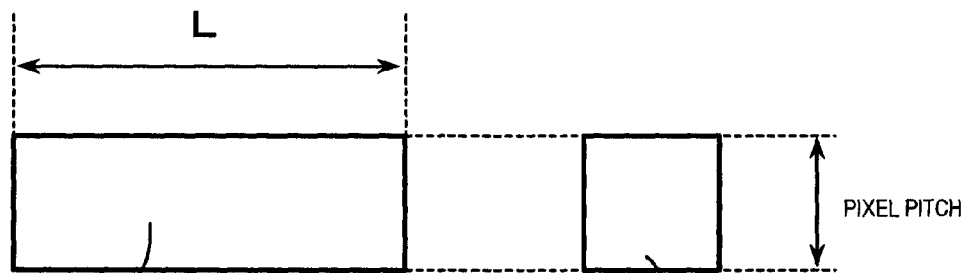
FIGS. 34A and 34B are schematic plan views for illustration the relationship between the pixel pitch and the circuit width L.
Figure 34B:
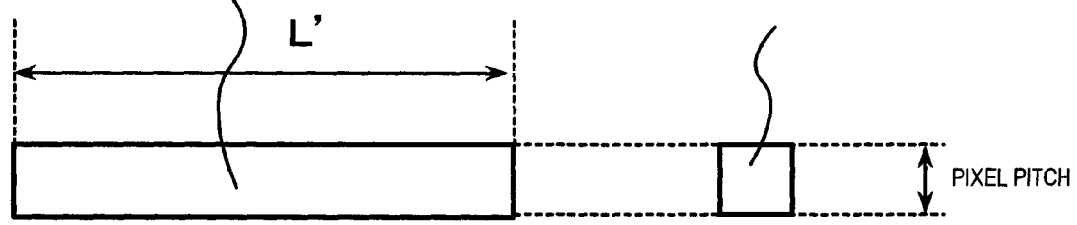

An eighth exemplary embodiment of the present invention will now be described. Similarly to the sixth exemplary embodiment, the present exemplary embodiment of the display is the same in configuration as the exemplary embodiment sown in FIG. 1. In the present exemplary embodiment, the first scanning circuit 5 and the second scanning circuit 6 are again arranged on both sides of the display section 4. The outputs of the respective scanning circuits are coupled by common gate bus lines 7. The pixels that make up the display section 4 of FIG. 1 may be configured as shown in FIG. 5 or 7. The configuration of the scanning circuit is the same as that of the seventh exemplary embodiment shown in FIG. 24. The present exemplary embodiment differs from the seventh exemplary embodiment as to the configuration of the output circuit 20. FIG. 26 shows the configuration of the output circuit 20 of the present exemplary embodiment.

Referring to FIG. 26, the output circuit 20 is basically a cascaded connection of an inverter circuit made up of a PMOS transistor P1 and an NMOS transistor N1, and an inverter circuit made up of a PMOS transistor P2 and an NMOS transistor N2. The present exemplary embodiment differs from the seventh exemplary embodiment as to a CMOS switch interposed between an output part of an inverter stage, made up by the PMOS transistors P2 and the NMOS transistor N2, and the terminal OUT. The CMOS switch is made up by an NMOS transistor N3 and a PMOS transistor P3. A signal line D is connected to the gate of the NMOS transistor N3, while a signal line /D is connected to the gate of the PMOS transistor P3. Thus, the transistors N3 and P3 are controlled on/off by the signals D and /D output from the externally connected device, not shown.

The operation of the scanning circuit of the present exemplary embodiment is basically is not different from that of the seventh exemplary embodiment, and is as shown in the timing chart of FIG. 23. The present exemplary embodiment differs from the seventh exemplary embodiment in that the terminal OUT of the output circuit 20 is electrically disconnected by the CMOS switch via the control signals D and /D.

In the present exemplary embodiment, the circuit of the CMOS configuration may be used, as in the sixth exemplary embodiment. Further, a common start signal may be used for the first and second scanning circuits 5 and 6.

The above first to eighth exemplary embodiments have been described with a liquid crystal display taken as an example of the display.

However, the display is not limited to a liquid crystal display, provided that the display is a matrix type display that receives video signals delivered from outside to output a corresponding image on a display part. For example, the display may also be a luminescent type display in which a display part is formed by a set of light emitting devices which, on applying the current thereto, is capable of transitioning to a light emitting state. Examples of the luminescent display include an inorganic or organic EL (Electro-Luminescence) display. The present invention may also be applied to a display which may be driven by sequentially scanning a set of active devices arranged in a matrix pattern.

The disclosures of the above-listed Patent Publications are to be incorporated herein by reference. The exemplary embodiments or examples can be changed or adjusted within the framework of the entire disclosures of the present invention, inclusive of the claims, based on the fundamental technical concept of the invention. Various combinations or selections of disclosed elements are also possible within the framework of the claims of the present invention. That is, the present invention naturally comprises various changes or corrections that may be made by those skilled in the art based on the entire disclosures, inclusive of claims, and on its technical concept.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor circuit comprising:
    a first scanning circuit; and
    a second scanning circuit;
        each of the first and second scanning circuits including a plurality of unit registers connected in cascade, wherein,
        an output terminal of each of the unit registers of the first scanning circuit and an output terminal of each of the unit registers of the second scanning circuit, corresponding to each other, are coupled to each other, and
        each of the unit registers of the first and second scanning circuits includes a thin film transistor (TFT) circuit that, responsive to a control signal supplied to a control terminal thereof, switches an output state of said each of the unit registers of the first and second scanning circuits between a state in which an output signal is output and a state in which no output signal is output,
        wherein the unit register of each of the first and second scanning circuits is driven by a three-phase clock;
        two neighboring phases of the three-phase clock being respectively supplied to first and second clock terminals of the unit register of each of the first and second scanning circuits,
        wherein the output terminal of each of the unit registers of each of the first and second scanning circuits is connected to an associated one of a plurality of gate lines, the output terminal of the unit register arranged at a stage other than a final stage of each of the first and second scanning circuits being connected to an input terminal of the unit register arranged at a next stage;
        a pulse being supplied to an input terminal of the unit registers of an initial stage of each of the first and second scanning circuits, the pulse delivered to the unit register of the initial stage being transferred to respective trailing side stage unit registers as the pulse phase is shifted from one unit register to the next, wherein
        a first signal that prescribes one scanning direction is supplied to the control terminal of the unit register of the first scanning circuit; and
        a second signal that prescribes a scanning direction reverse to the one scanning direction is supplied to the control terminal of the unit register of the second scanning circuit,
        the second signal being complementary to the first signal, and wherein
        the thin film transistor (TFT) circuit of the unit register includes:
        a first transistor having a drain and a gate connected to the second clock terminal of the unit register;
        a second transistor having a drain connected to a source of the first transistor, having a gate connected to the input terminal of the unit register and having a source connected to a first power supply;
        a third transistor having a drain and a gate connected to the input terminal of the unit register;
        a fourth transistor having a drain connected to a source of the third transistor, having a gate connected to a connection node between the source of the first transistor and the drain of the second transistor, and having a source connected to the first power supply;
        a fifth transistor having a drain connected to the first clock terminal of the unit register, and having a source connected to the output terminal of the unit register;
        a sixth transistor having a drain connected to the output terminal of the unit register, and having a gate connected to a connection node between the source of the first transistor and the drain of the second transistor and a gate of the fourth transistor; and
        a seventh transistor having a drain connected to a source of the sixth transistor, having a gate connected to the control terminal of the unit register and having a source connected to the first power supply.

2. The semiconductor circuit according to claim 1, wherein the thin film transistor (TFT) circuit of the unit register further includes an eighth transistor having a drain connected to the first clock terminal, having a source connected to the drain of the fifth transistor, and having a gate connected to the control terminal of the unit register.

* * * * *